US012787287B2

(12) United States Patent
Yang

(10) Patent No.: US 12,787,287 B2
(45) Date of Patent: Nov. 3, 2026

(54) MEMORY DEVICE AND MANUFACTURING METHOD THEREOF

(71) Applicant: MACRONIX INTERNATIONAL CO., LTD., Hsinchu (TW)

(72) Inventor: Chih-Kai Yang, Kaohsiung City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 371 days.

(21) Appl. No.: 18/598,047

(22) Filed: Mar. 7, 2024

(65) Prior Publication Data

US 2025/0287587 A1 Sep. 11, 2025

(51) Int. Cl.
*H10B 43/27* (2023.01)
*H10W 42/60* (2026.01)

(52) U.S. Cl.
CPC ............ *H10B 43/27* (2023.02); *H10W 42/60* (2026.01)

(58) Field of Classification Search
CPC ........ H10B 43/27; H10B 41/27; H10B 43/10; H10B 41/10
See application file for complete search history.

(56) References Cited

U.S. PATENT DOCUMENTS

| | | | | |
|---|---|---|---|---|
| 2020/0350330 A1* | 11/2020 | Ahn | ........................ | H10B 43/27 |
| 2021/0383874 A1* | 12/2021 | Oh | ........................ | G11C 16/24 |
| 2023/0301102 A1* | 9/2023 | Ahn | ........................ | H10B 43/27 |
| 2024/0381641 A1* | 11/2024 | Park | ........................ | H10B 41/40 |

FOREIGN PATENT DOCUMENTS

| | | | |
|---|---|---|---|
| TW | 202129917 | A | 8/2021 |
| TW | 202211442 | A | 3/2022 |
| TW | 202339211 | A | 10/2023 |
| TW | 202401789 | A | 1/2024 |

* cited by examiner

*Primary Examiner* — Alia Sabur
(74) *Attorney, Agent, or Firm* — McClure, Qualey & Rodack, LLP

(57) ABSTRACT

A memory device includes an array region, a staircase region, a reference structure in the array region and the staircase region, a stacked structure in the array region and the staircase region, and a wall structure extending along a direction from the array region to the staircase region. The reference structure includes a conductive structure and a dielectric structure embedded within the conductive structure in the staircase region. The dielectric structure includes a first dielectric layer and a second dielectric layer disposed on a top surface, a sidewall and a bottom surface of the first dielectric layer. The sidewall of the first dielectric layer is connected to the top surface and the bottom surface of the first dielectric layer. The stacked structure includes conductive layers and insulating layers alternately stacked over the reference structure. The wall structure penetrates the stacked structure and beyond the dielectric structure.

19 Claims, 37 Drawing Sheets

100

100

MEMORY DEVICE AND MANUFACTURING METHOD THEREOF

BACKGROUND

Technical Field

The present disclosure relates to a memory device and a manufacturing method of the memory device.

Description of Related Art

In semiconductor industry, the structures of memory devices have been changed constantly, and the storage capacity of the memory devices has been increased continuously. Memory devices are used in storage elements for many products such as MP3 players, digital cameras, computer files, and so on. As the application increases, the demand for the memory devices focuses on small size and large memory capacity. For satisfying the requirement, a memory device having a high element density, a small size and a solid structure are in need. Therefore, it is important to provide robust processes in the manufacture of the memory devices.

SUMMARY

One aspect of the present disclosure is a memory device.

According to some embodiments of the present disclosure, a memory device includes an array region, a staircase region, a reference structure, a stacked structure and a wall structure. The reference structure is disposed in the array region and the staircase region, and the reference structure includes a conductive structure and a dielectric structure embedded within the conductive structure in the staircase region. The dielectric structure includes a first dielectric layer and a second dielectric layer disposed on a top surface of the first dielectric layer, a sidewall of the first dielectric layer and a bottom surface of the first dielectric layer, in which the sidewall of the first dielectric layer is connected to the top surface of the first dielectric layer and the bottom surface of the first dielectric layer. The stacked structure includes a plurality of conductive layers and a plurality of insulating layers alternately stacked over the reference structure, and the stacked structure is disposed in the array region and the staircase region. The wall structure extends along a direction from the array region to the staircase region, and the wall structure penetrates the stacked structure and beyond the dielectric structure.

In some embodiments of the present disclosure, the conductive structure includes a first conductive layer and a second conductive layer. The first conductive layer is disposed under the dielectric structure. The second conductive layer is disposed over the first conductive layer, and the second conductive layer includes a first portion along a top surface of the dielectric structure and a second portion along a sidewall of the dielectric structure in the staircase region.

In some embodiments of the present disclosure, a bottommost surface of the second dielectric layer of the dielectric structure is disposed below a topmost surface of the first conductive layer.

In some embodiments of the present disclosure, the memory devices further includes a discharge electrode extending downwards from a bottom surface of the first conductive layer and in electrical contact with the reference structure.

In some embodiments of the present disclosure, the second dielectric layer of the dielectric structure is in contact with a sidewall of the second portion of the second conductive layer.

In some embodiments of the present disclosure, a portion of the second dielectric layer of the dielectric structure extends to a bottom surface of the second portion of the second conductive layer.

In some embodiments of the present disclosure, the memory device further includes a substrate over the stacked structure.

In some embodiments of the present disclosure, the wall structure is in electrical contact with the reference structure.

In some embodiments of the present disclosure, the memory device further includes a discharge electrode extending downwards from a bottom surface of the reference structure and in electrical contact with the reference structure in a discharge region.

In some embodiments of the present disclosure, the conductive structure includes a first conductive layer and a second conductive layer. The second conductive layer is disposed over the first conductive layer. A ratio of a thickness of the second conductive layer to a width of the discharge electrode is larger than 2.

In some embodiments of the present disclosure, the first dielectric layer and the second dielectric layer include different materials.

Another aspect of the present disclosure is a memory device.

According to some embodiments of the present disclosure, a memory device includes a reference structure, a stacked structure and a wall structure. The reference structure includes a conductive structure and a dielectric structure embedded within the conductive structure. The dielectric structure includes a first dielectric layer and a second dielectric layer. The second dielectric layer has an extension portion extending downward from a bottom surface of the second dielectric layer. The stacked structure including a plurality of conductive layers and a plurality of insulating layers alternately stacked over the reference structure. The wall structure penetrates the stacked structure and beyond the dielectric structure.

In some embodiments of the present disclosure, the second dielectric layer of the dielectric structure covers a top surface of the first dielectric layer, a sidewall of the first dielectric layer and a bottom surface of the first dielectric layer.

In some embodiments of the present disclosure, the extension portion of the second dielectric layer of the dielectric structure has an L-shaped cross-section.

In some embodiments of the present disclosure, the conductive structure includes a first conductive layer and a second conductive layer over the first conductive layer. The dielectric structure is disposed between the first conductive layer and the second conductive layer.

In some embodiments of the present disclosure, the memory device further includes a discharge electrode extending downwards from the first conductive layer and in electrical contact with the reference structure.

In some embodiments of the present disclosure, a bottommost surface of the extension portion of the second dielectric layer of the dielectric structure is below a topmost surface of the first conductive layer.

In some embodiments of the present disclosure, the memory device further includes a discharge electrode extending downwards from the reference structure and in electrical contact with the reference structure.

In some embodiments of the present disclosure, the wall structure includes a conductive material with an insulating material on sidewalls.

Another aspect of the present disclosure is a manufacturing method of a memory device.

According to some other embodiments of the present disclosure, the manufacturing method of a memory device includes forming a first conductive layer and a dielectric stack in an array region and a staircase region of the memory device. An opening is formed in a first portion of the dielectric stack in the staircase region. A dielectric material is deposited over the dielectric stack and lining the opening. A second conductive layer is formed over the dielectric material and filling the opening. Insulating layers and sacrificial material layers are formed alternately stacked over the second conductive layer. A memory structure is formed through the insulating layers, the sacrificial material layers, the second conductive layer, the dielectric stack and the first conductive layer in the array region. A slit trench is formed through the insulating layers, the sacrificial material layers and the second conductive layer in the array region and the staircase region, in which the slit trench exposes a sidewall of the second conductive layer and a sidewall of the dielectric material in the staircase region. An etching process is performed to remove a second portion of the dielectric stack in the array region to expose the memory structure, in which the first portion of the dielectric stack in the staircase region remains after the etching process is complete. A bottom electrode layer is formed in electrical contact with the memory structure. The sacrificial material layers are replaced with conductive layers.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1A:
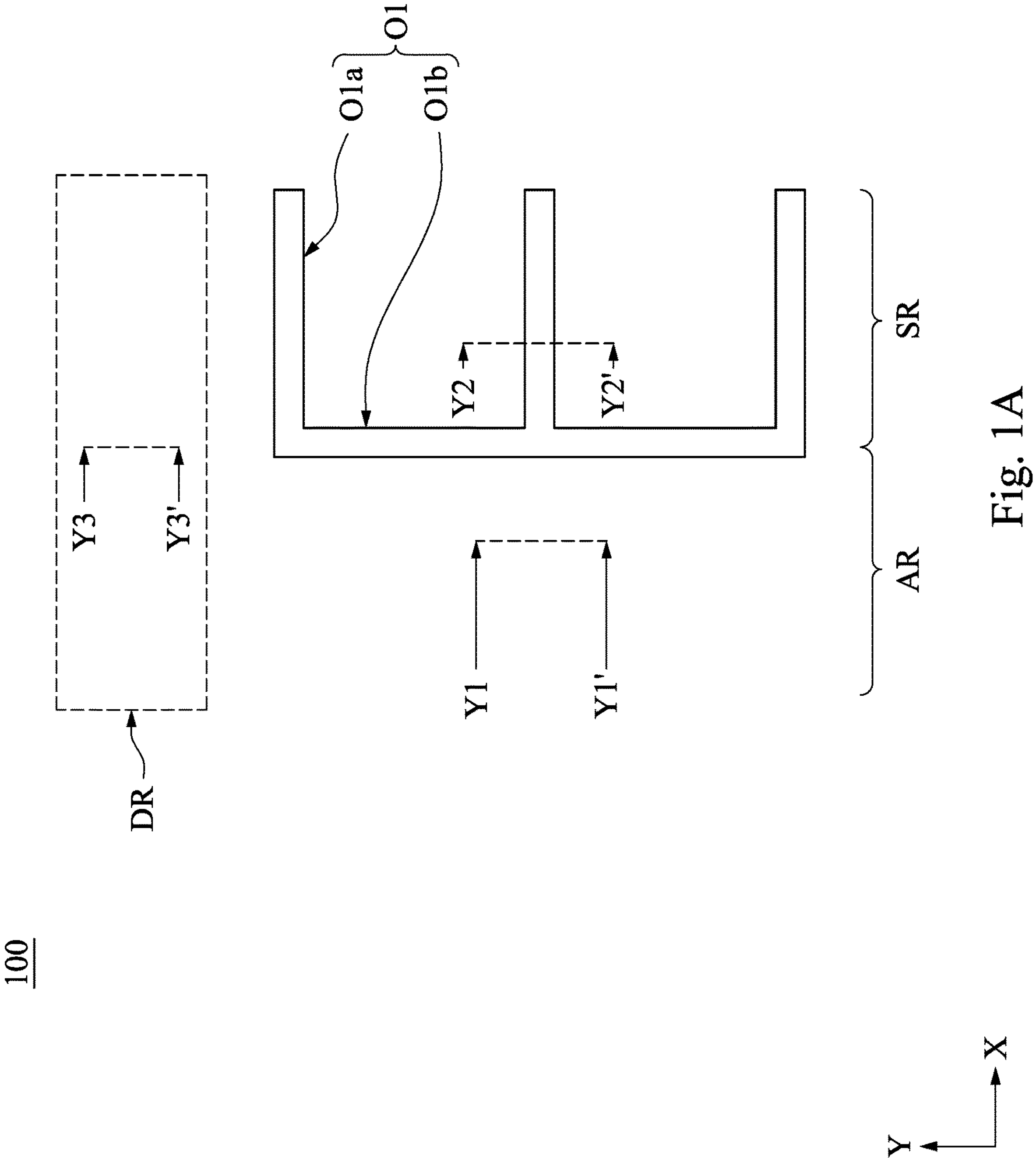
FIGS. 1A, 2A, 3A, 4A, 5A, 6A, 7A, 8A, 9A, 10A, 11A, 12A, 13A, 14A, 15A and 16A are top views of a process at various stages of a manufacturing method of a memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about", "approximately", or "substantially" shall generally mean within 10 percent, or within 5 percent of a given value or range. Numerical quantities given herein are approximated, meaning that the term "around", "about", "approximately", or "substantially" can be inferred if not expressly stated.

In the embodiments of the present disclosure, a memory device and a manufacturing method of the same are provided. The memory device 100 includes an array region AR, a staircase region SR and a discharge region DR. The array region AR is a region to form a memory array. The staircase region SR is adjacent to the array region AR. The discharge region DR may be disposed in a region of the array region AR without forming a memory structure and/or a wall structure described in more detail below or a region of the staircase region without forming a support pillar structure described in more detail below. The discharge region DR may be disposed in four edges of a semiconductor die, scribe lines, and so on. It is noted that the term "top view" may be used herein for ease of description to refer to as a cross-sectional view of a dielectric layer 150 (i.e., the cross-section along line A-A' in FIG. 1B) of the memory device 100 in order to highlight the technical features of the inventive concept. Further, FIGS. 1A, 2A, 3A, 4A, 5A, 6A, 7A, 8A, 9A, 10A, 11A, 12A, 13A, 14A, 15A, and 16A are top views of layouts of the memory device 100 according to some embodiments of the present disclosure, and some elements are not illustrated in those top views for simplicity. FIGS. 1A-1B, 2A-2B, 3A-3B, 4A-4B, 5A-5B, 6A-6B, 7A-7B, 8A-8B, 9A-9B, 10A-10B, 11A-11B, 12A-12C, 13A-13B, 14A-14B, 15A-15B, and 16A-16B are views of a process at various stages of a manufacturing method of a memory device 100 according to some embodiments of the present disclosure.

Figure 1B:
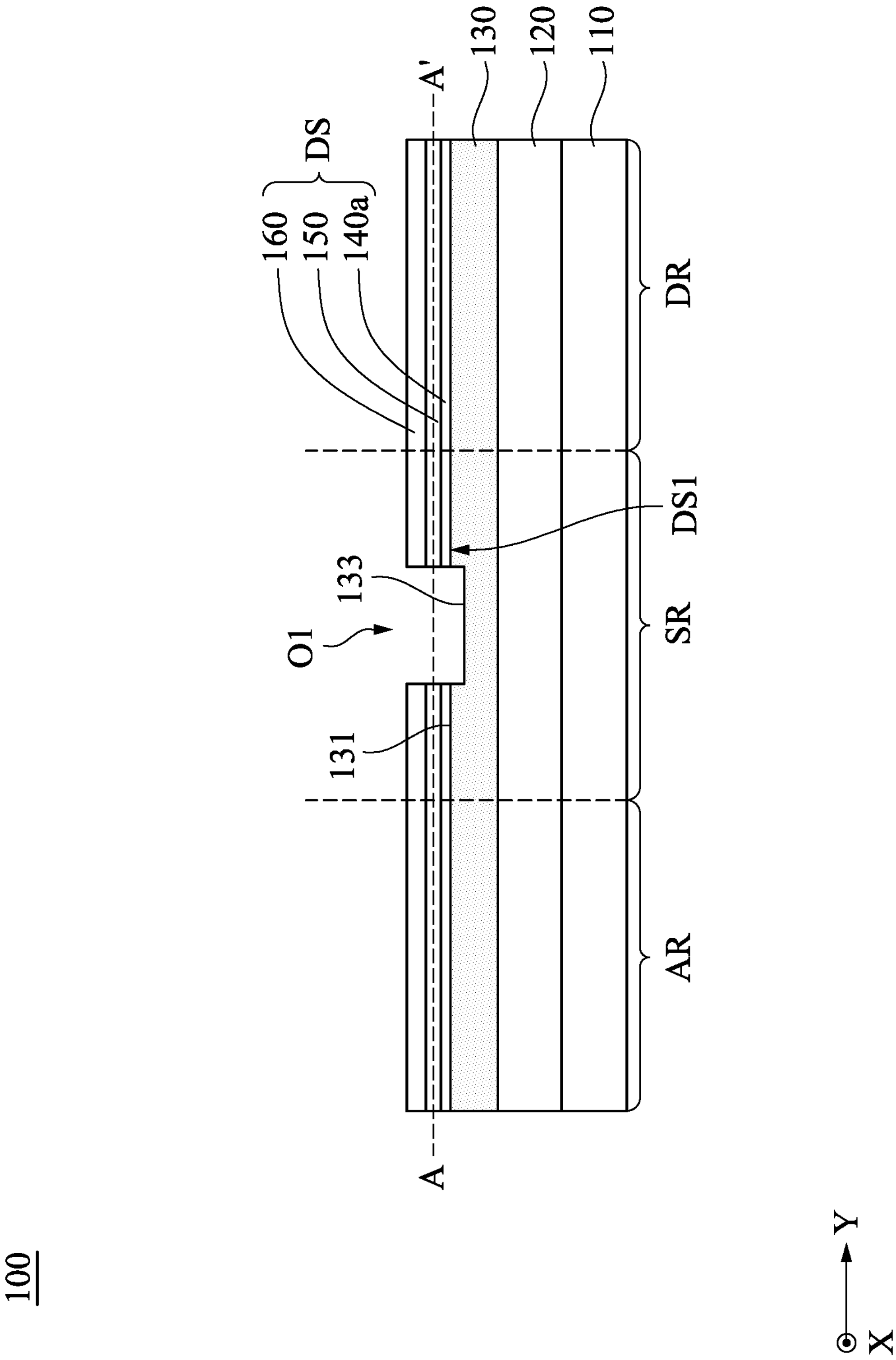
FIGS. 1B, 2B, 3B, 4B, 5B, 6B, 7B, 8B, 9B, 10B, 11B, 12B, 13B, 14B, 15B and 16B are cross-sectional views of a process at various stages of a manufacturing method of a memory device according to some embodiments of the present disclosure.

FIG. 1A is a top view of a step of manufacturing the memory device 100, and FIG. 1B is a cross-sectional view of the memory device 100 including the array region AR, the staircase region SR, and the discharge region DR respectively taken along line Y1-Y1', line Y2-Y2', and line Y3-Y3' in FIG. 1A. Referring to FIGS. 1A and 1B, a substrate 110 is provided. The substrate 110 extends along a plane defined by a first direction X (or referred as X axis) and a second direction Y (or referred as Y axis), in which the first direction X is perpendicular to the second direction Y. An insulating layer 120 is formed on the substrate 110. Then, a first conductive layer 130 and a dielectric stack DS are formed over the substrate 110 in the array region AR, the staircase region SR, and the discharge region DR. The insulating layer 120 is in contact with the substrate 110. The first conductive layer 130 is formed over and in contact with the insulating layer 120. The dielectric stack DS is formed over and in contact with the first conductive layer 130.

In some embodiments, forming the dielectric stack DS includes forming a dielectric layer 140*a*, a dielectric layer 150, and a dielectric layer 160 in sequence. The dielectric layer 140*a* is in contact with the first conductive layer 130, the dielectric layer 150 is in contact with the dielectric layer 140*a*, and the dielectric layer 160 in contact with the dielectric layer 150. In some embodiments, the dielectric layer 140*a* is separated from the dielectric layer 160 by the dielectric layer 150. In some embodiments, the dielectric layer 140*a* and the dielectric layer 150 include different materials, and the dielectric layer 140*a* and the dielectric layer 160 include the same material. For example, the dielectric layer 140*a* includes oxide (e.g., silicon oxide), the dielectric layer 150 includes nitride (e.g., silicon nitride), and the dielectric layer 160 includes oxide (e.g., silicon oxide).

After forming the dielectric stack DS over the substrate 110, an opening O1 is formed in a first portion DS1 of the dielectric stack DS in the staircase region SR. In greater details, the opening O1 downwards penetrates through the dielectric stack DS and exposes the first conductive layer 130. In some embodiments, forming the opening O1 further includes etching a portion of the first conductive layer 130 such that an etched surface 133 of the first conductive layer 130 is below a top surface 131 of the first conductive layer 130 (or a bottommost surface of the dielectric stack DS). In some embodiments, a patterned photoresist is formed on the dielectric layer 160 of the dielectric stack DS, in which the patterned photoresist may be formed by suitable deposition, development and/or etching techniques. Then, the dielectric stack DS not covered by the patterned photoresist is etched by using the patterned photoresist as an etching mask to form the opening O1. After the opening O1 are formed, the patterned photoresist may be removed by using a photoresist stripping process (e.g., ashing process).

As shown in FIG. 1A, the opening O1 is disposed in the staircase region SR and spaced apart from the array region AR. The opening O1 may include first portions O1*a* and a second portion O1*b* substantially perpendicular to the first portions O1*a*. Specifically, the first portions Ola extend along the first direction X and the second portion O1*b* extends along the second direction Y. The first portions Ola are connected to the second portion O1*b*. In some embodiments, the opening O1 has a comb shape top profile.

In some embodiments, the substrate 110 is a semiconductor substrate, such as a silicon substrate, a silicon germanium substrate, a silicon carbide substrate, or the like. The substrate 110 may include interconnect structures having conductive contacts, transistors, or other similar components. In some embodiments, the insulating layer 120 and the dielectric layer 140*a* include the same material. For example, the insulating layer 120 and the dielectric layer 140*a* includes oxide (e.g., silicon oxide). In some embodiments, the first conductive layer 130 includes semiconductor materials (e.g., polysilicon).

Figure 2A:
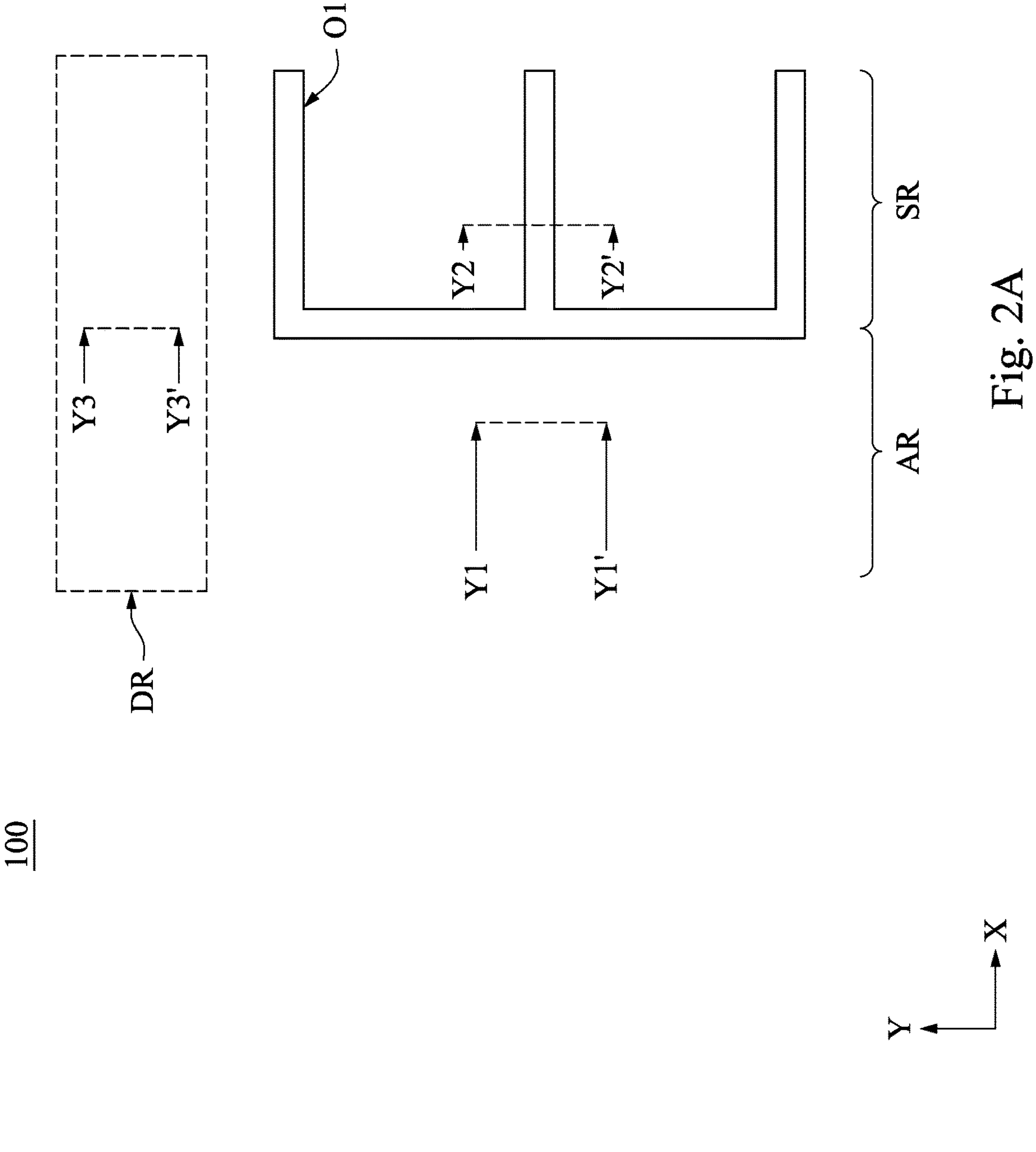
Figure 2B:
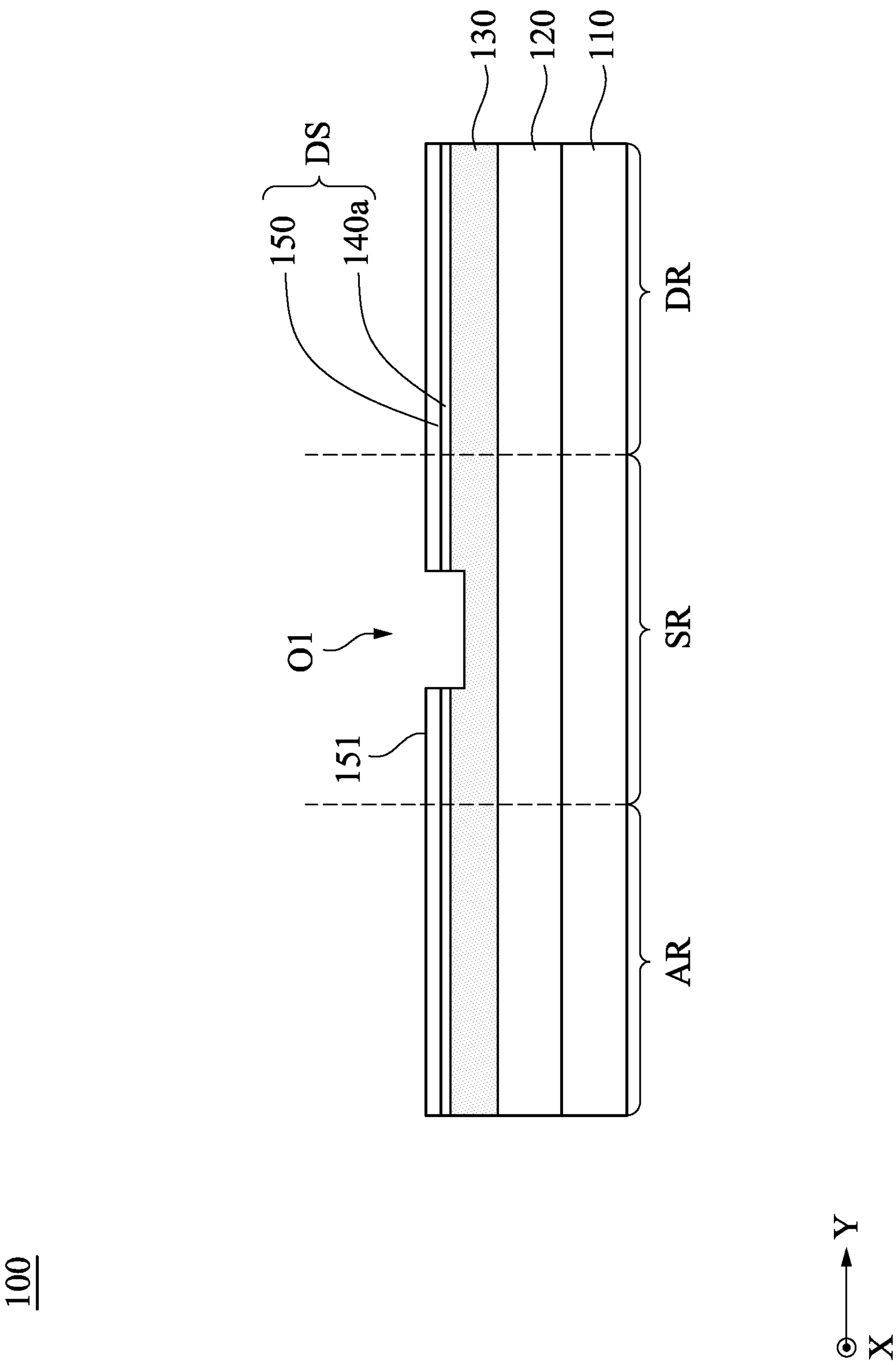

FIG. 2A is a top view of a step of manufacturing the memory device 100, and FIG. 2B is a cross-sectional view of the memory device 100 including the array region AR, the staircase region SR, and the discharge region DR respectively taken along line Y1-Y1', line Y2-Y2', and line Y3-Y3' in FIG. 2A. Referring to FIGS. 1A-1B and 2A-2B, after forming the opening O1, an etching process is performed to remove the dielectric layer 160 of the dielectric stack DS such that a top surface 151 of the dielectric layer 150 of the dielectric stack DS is exposed. In some embodiments, the etching process of removing the dielectric layer 160 is a dry etching process, a wet etching process, or a combination thereof.

Figure 3A:
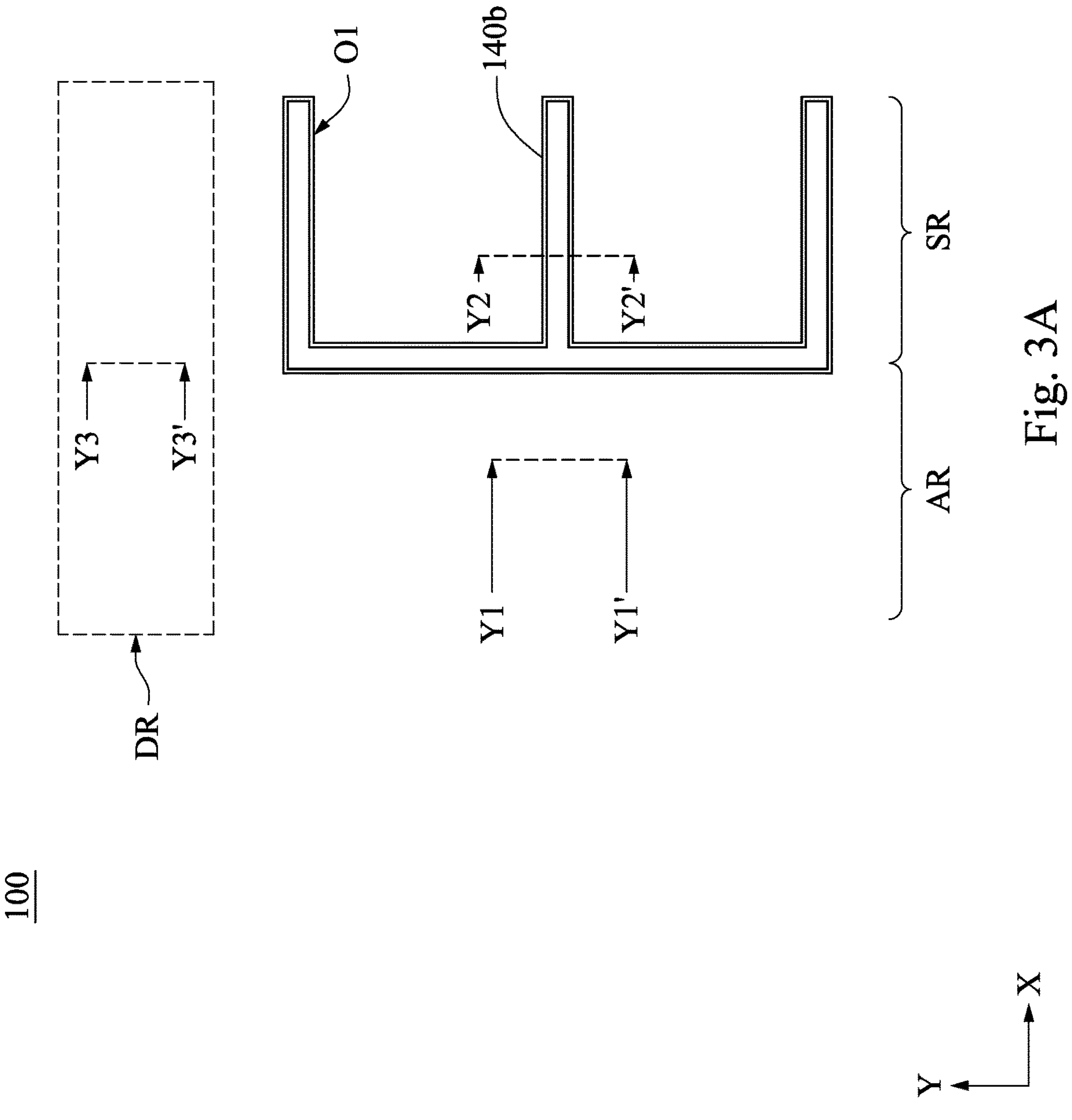
Figure 3B:
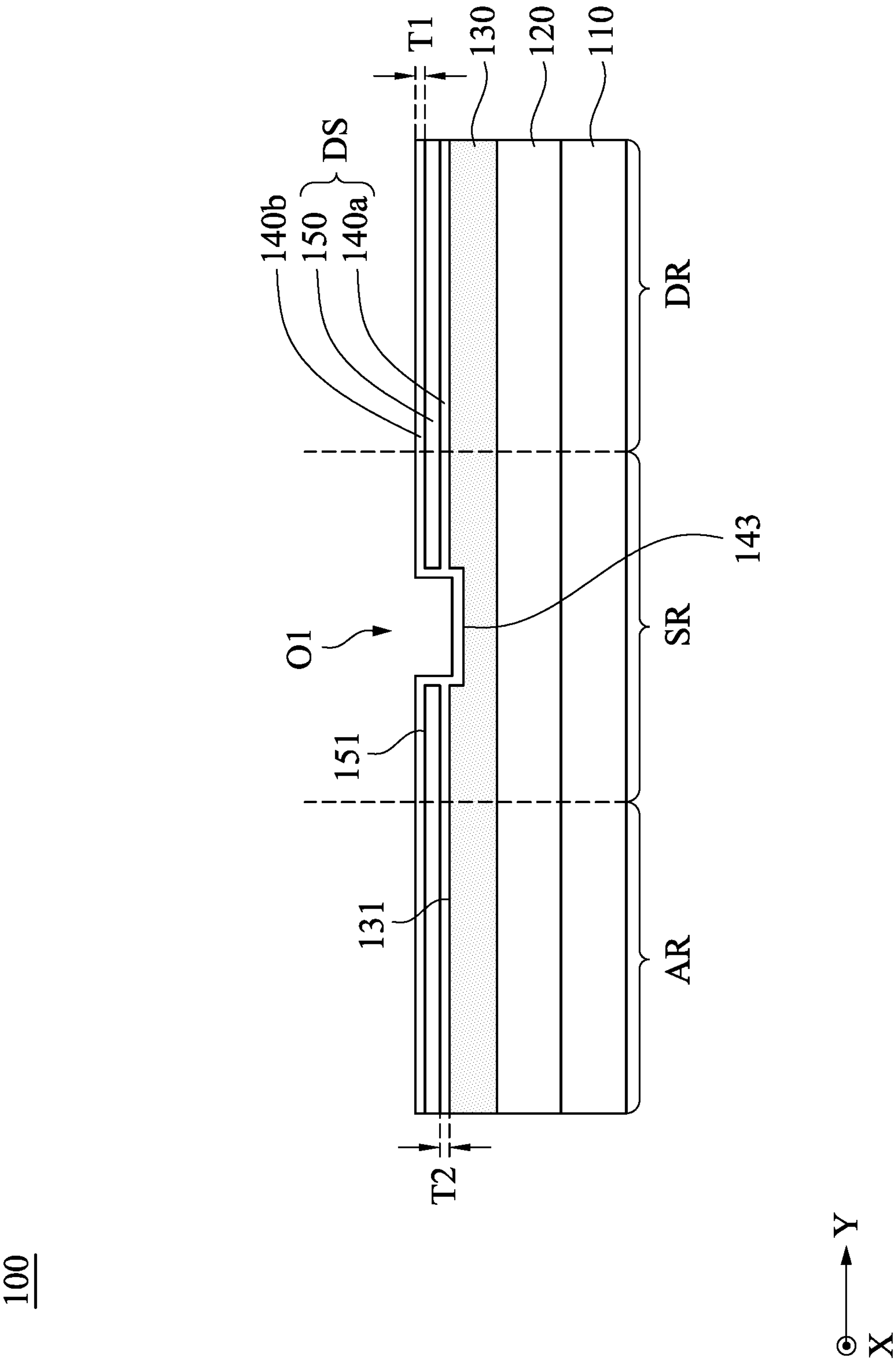

FIG. 3A is a top view of a step of manufacturing the memory device 100, and FIG. 3B is a cross-sectional view of the memory device 100 including the array region AR, the staircase region SR, and the discharge region DR respectively taken along line Y1-Y1', line Y2-Y2', and line Y3-Y3' in FIG. 3A. Referring to FIGS. 3A and 3B, a dielectric material 140*b* is deposited over the dielectric stack DS and lining the opening O1. In some embodiments, the dielectric material 140*b* covers the top surface 151 of the dielectric layer 150 of the dielectric stack DS. The dielectric material 140*b* is in contact with the first conductive layer 130 and a sidewall of the dielectric stack DS. In some embodiments, a bottommost surface 143 of the dielectric material 140*b* is below a topmost surface 131 of the first conductive layer 130. In some embodiments, a thickness T1 of the dielectric material 140*b* is greater than or equal to a thickness T2 of the dielectric layer 140*a* of the dielectric stack structure DS. In some embodiments, a ratio of the thickness T1 of the dielectric material 140*b* to the thickness T2 of the dielectric layer 140*a* is in a range from 1 to 2. In some embodiments, since the dielectric layer 140*a* of the dielectric stack DS and the dielectric material 140*b* include the same material (e.g., oxide), the dielectric layer 140*a* of the dielectric stack DS and the dielectric material 140*b* are collectively referred as a single dielectric layer (i.e., second dielectric layer 140 in FIG. 16B).

Figure 4A:
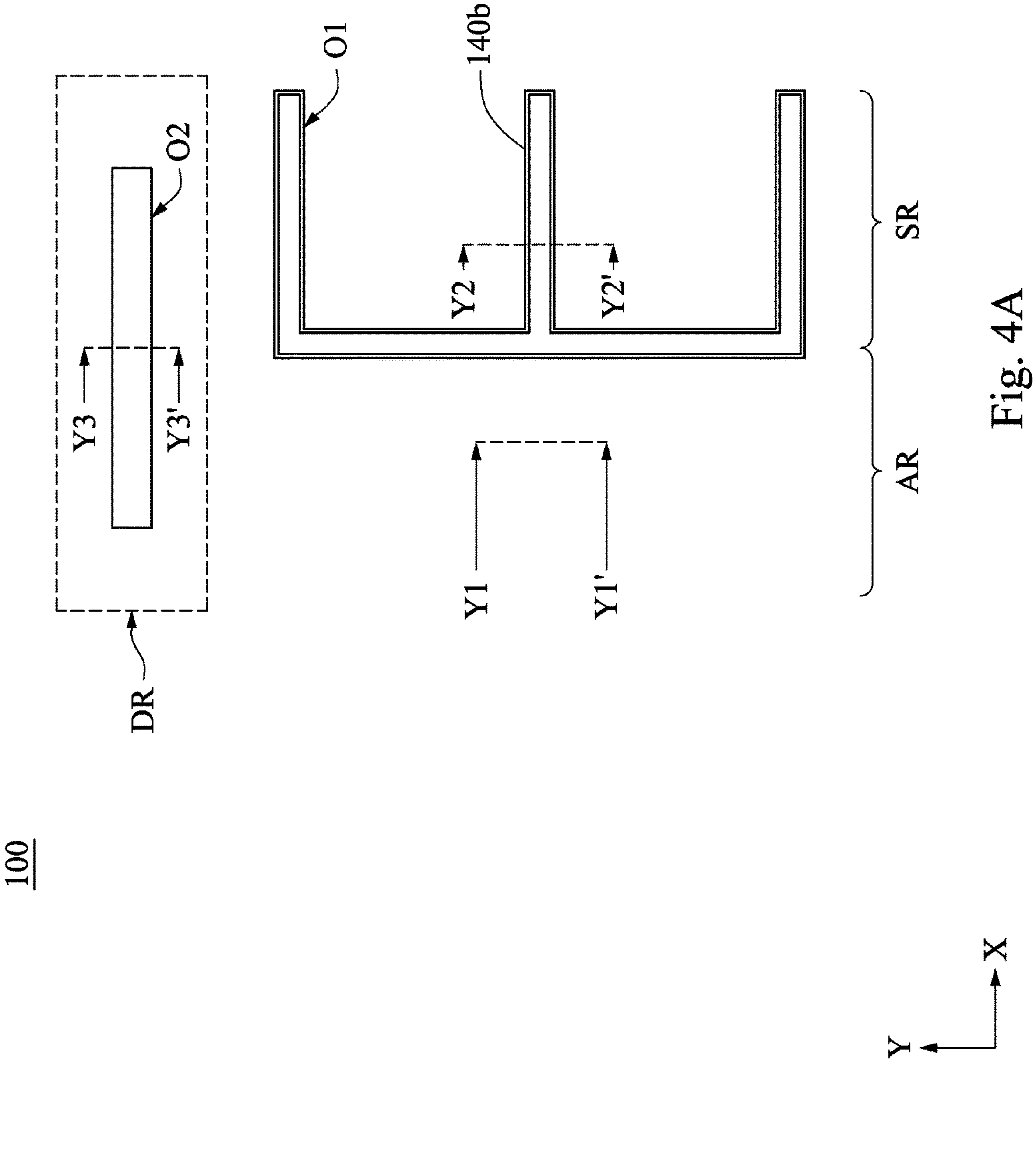
Figure 4B:
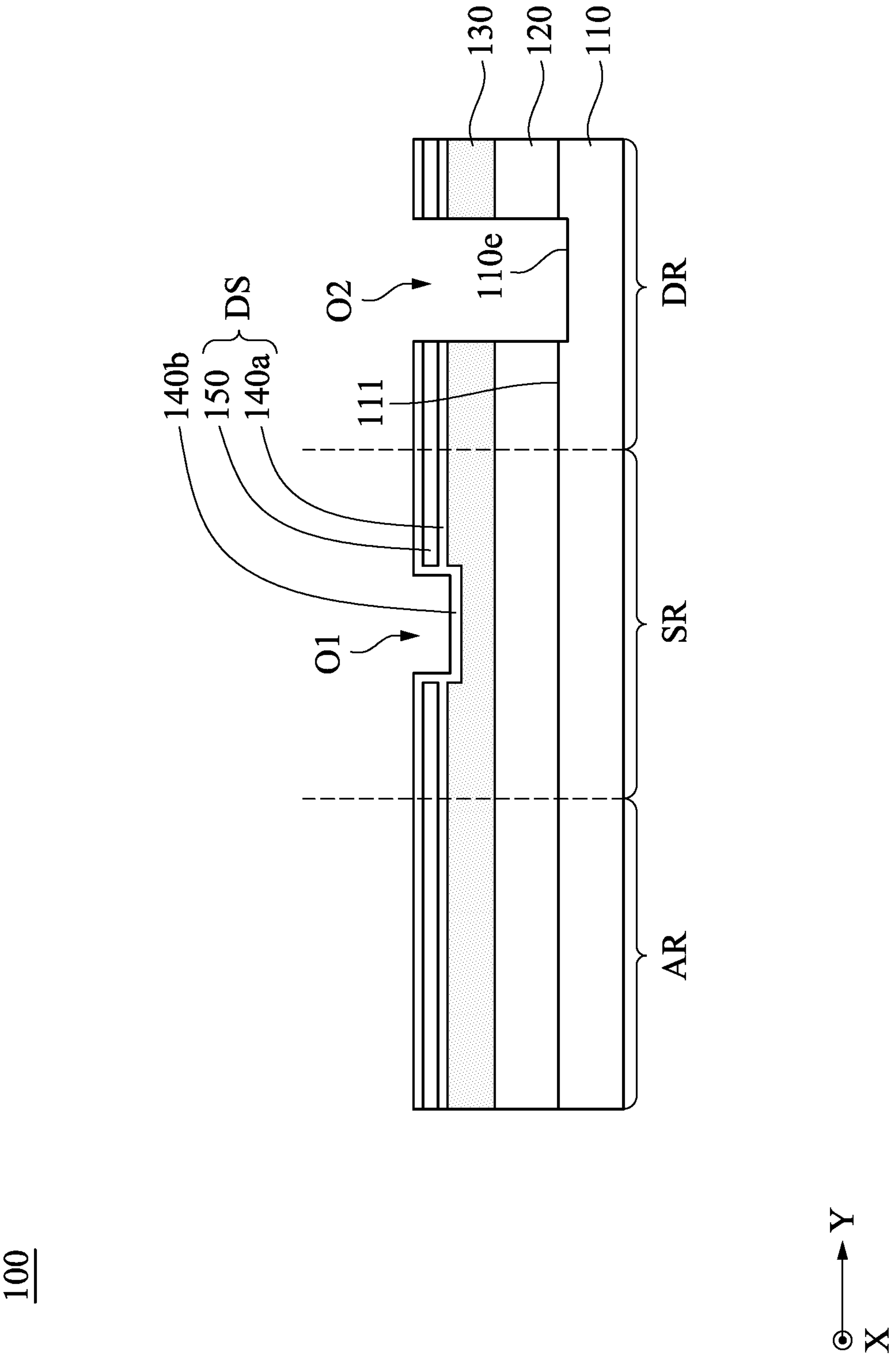

FIG. 4A is a top view of a step of manufacturing the memory device 100, and FIG. 4B is a cross-sectional view of the memory device 100 including the array region AR, the staircase region SR, and the discharge region DR respectively taken along line Y1-Y1', line Y2-Y2', and line Y3-Y3' in FIG. 4A. Referring to FIGS. 4A and 4B, an opening O2 is formed downwards penetrating the dielectric material 140*b*, the dielectric stack DS, the first conductive layer 130 and the insulating layer 120 in the discharge region DR. The opening O2 may expose the substrate 110 in the discharge region DR, and the opening O2 may be referred as a discharge via. In some embodiments, forming the opening O2 further includes etching a portion of the substrate 110 in the discharge region DR such that an exposed surface 110*e* of the substrate 110 is below a top surface 111 of the substrate 110 (or a bottommost surface of the insulating layer 120). In some embodiments, a patterned photoresist is formed on the dielectric material 140*b*, in which the patterned photoresist may be formed by suitable deposition, development and/or etching techniques. Then, the dielectric material 140*b* not covered by the patterned photoresist is etched by using the patterned photoresist as an etching mask to form the opening O2. After the opening O2 are formed, the patterned photoresist may be removed by using a photoresist stripping process (e.g., ashing process).

Figure 5A:
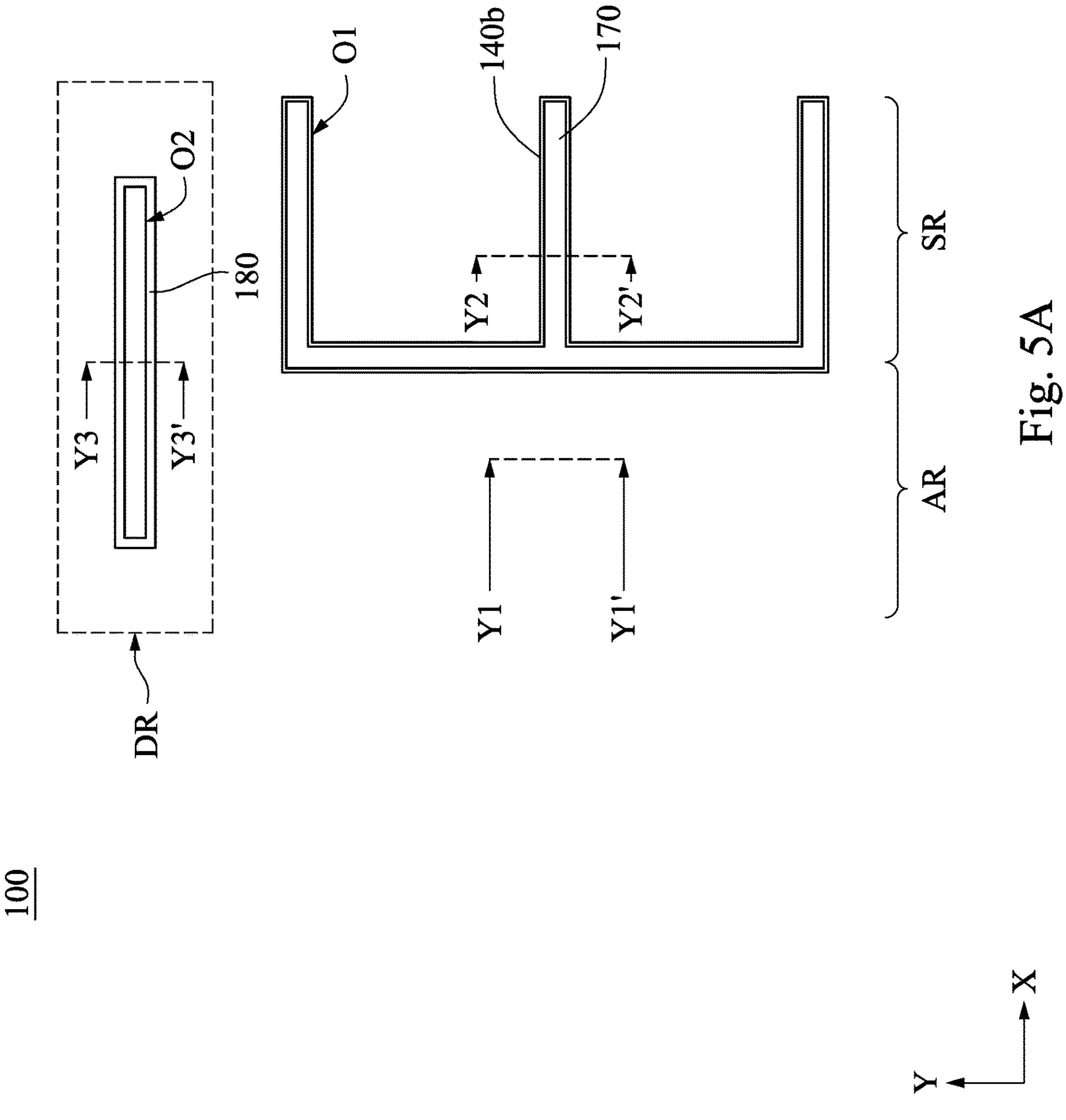
Figure 5B:
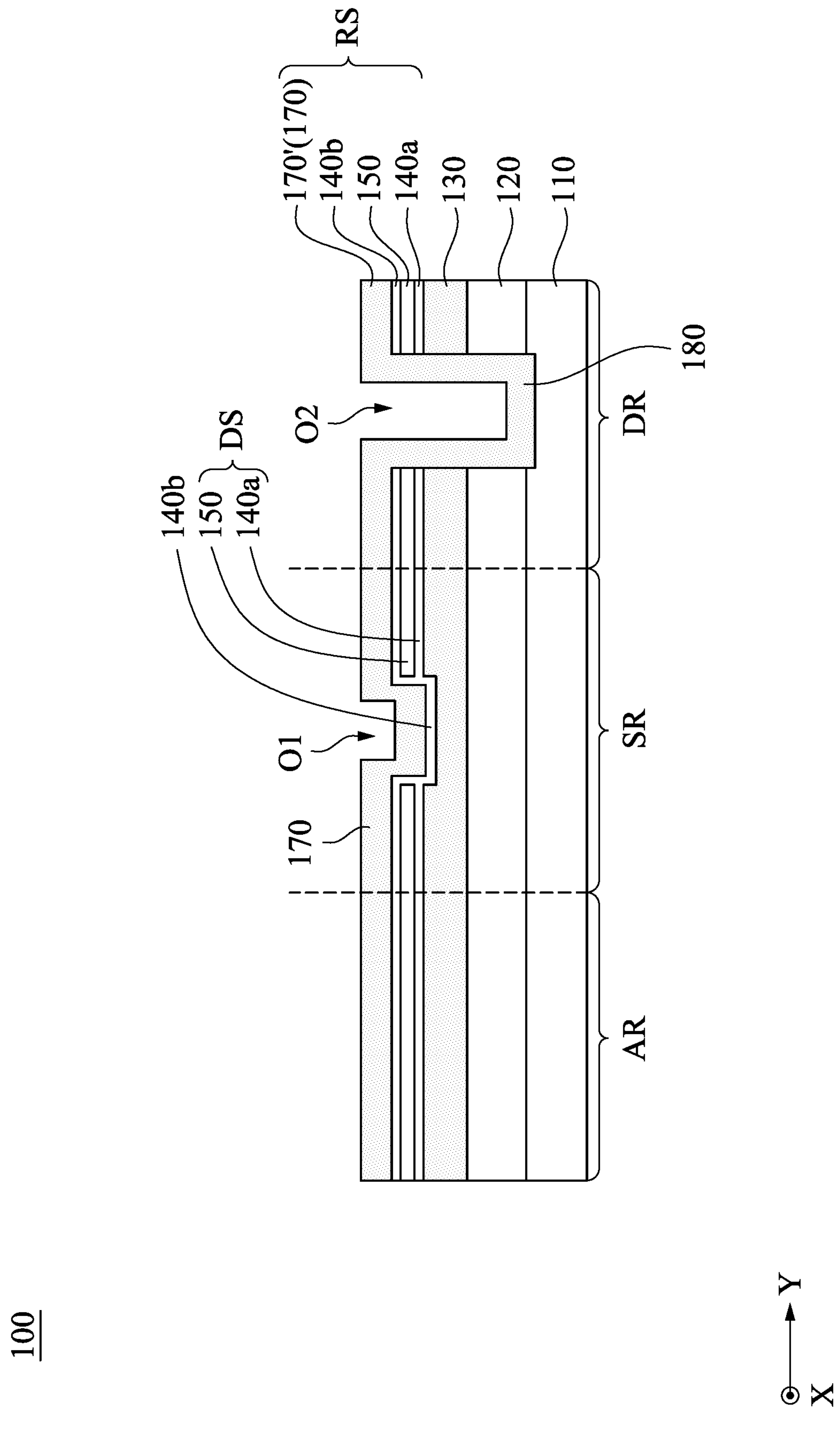

FIG. 5A is a top view of a step of manufacturing the memory device 100, and FIG. 5B is a cross-sectional view of the memory device 100 including the array region AR, the staircase region SR, and the discharge region DR respectively taken along line Y1-Y1', line Y2-Y2', and line Y3-Y3' in FIG. 5A. Referring to FIGS. 5A and 5B, after forming the opening O2 in the discharge region DR, a conductive material 170' is deposited over the dielectric material 140*b*. Further, the conductive material 170' fills the opening O1 in the staircase region SR and the opening O2 in the discharge region DR. In some embodiments, the opening O1 in the staircase region SR is not entirely filled by the conductive material 170', and the opening O2 in the discharge region DR is not entirely filled by the conductive material 170'. With respect to the array region AR and the staircase region SR, the conductive material 170' is in contact with the dielectric material 140*b*; and with respect to the discharge region DR, the conductive material 170' is in contact with the dielectric material 140*b*, the dielectric stack DS, the first conductive layer 130, the insulating layer 120 and the substrate 110. It is noted that a portion of the conductive material 170' below the first conductive layer 130 in the discharge region DR may be referred as a discharge electrode 180 and other portions of the conductive material 170' in the array region AR, in the staircase region SR and in the discharge region DR may be referred as a second conductive layer 170. In greater details, the second conductive layer 170 is formed over the dielectric material **140*b* in the array region AR and the staircase region SR. The second conductive layer 170 is formed over dielectric material 140*b* and further extends from the dielectric material 140*b* to the first conductive layer 130 in the discharge region DR. The discharge electrode 180 extends downward from the first conductive layer 130 and in electrical contact with the first conductive layer 130**.

Figure 6A:
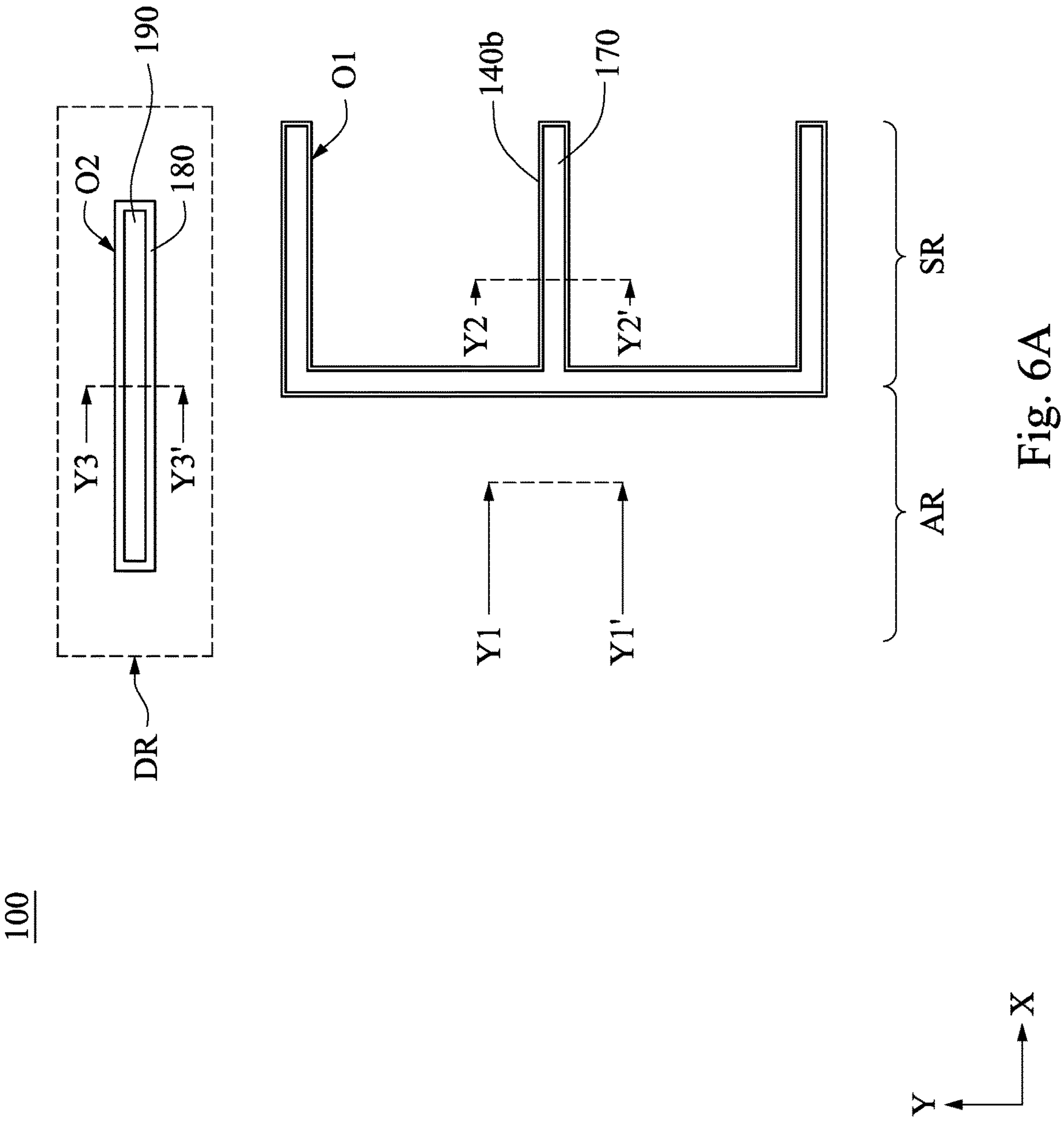
Figure 6B:
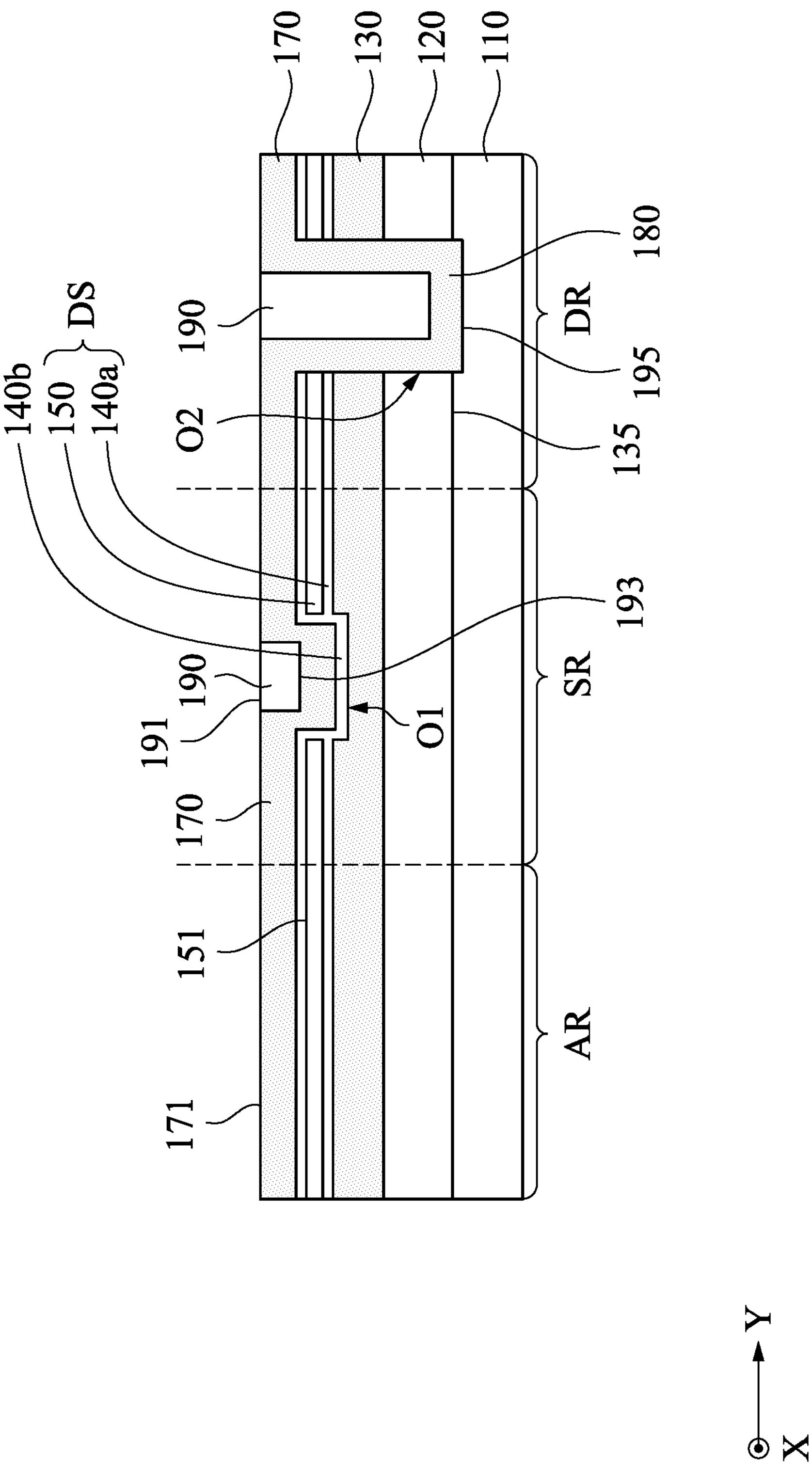

FIG. 6A is a top view of a step of manufacturing the memory device 100, and FIG. 6B is a cross-sectional view of the memory device 100 including the array region AR, the staircase region SR, and the discharge region DR respectively taken along line Y1-Y1', line Y2-Y2', and line Y3-Y3' in FIG. 6A. Referring to FIGS. 5A-5B and 6A-6B, after forming the conductive material 170' (i.e., the second conductive layer 170 and the discharge electrode 180), insulating structures 190 are filled in the opening O1 and opening O2. In greater details, the insulating structures 190 are formed over the second conductive layer 170 and the discharge electrode 180, and then a planarization process is performed to remove excess materials of the insulating structures 190 such that a topmost surface 171 of the second conductive layer 170 is substantially coplanar with a top surface 191 of one of the insulating structures 190. The planarization process may be a chemical mechanical planarization (CMP) process. In some embodiments, a bottom surface 193 of the insulating structures 190 in the staircase region SR is above the top surface 151 of the dielectric layer 150. In some embodiments, a bottom surface 195 of the insulating structure 190 in the discharge region DR is below a bottom surface 133 of the first conductive layer 130. In some embodiments, the insulating structures 190 include oxide. The insulating structures 190 and the dielectric material **140*b* may include the same material. In some embodiments, the first conductive layer 130, the conductive material 170' (second conductive layer 170 and discharge electrode 180) include the same material. For example, the first conductive layer 130 and the conductive material 170' (second conductive layer 170 and discharge electrode 180**) include semiconductor materials (e.g., polysilicon).

Figure 7A:
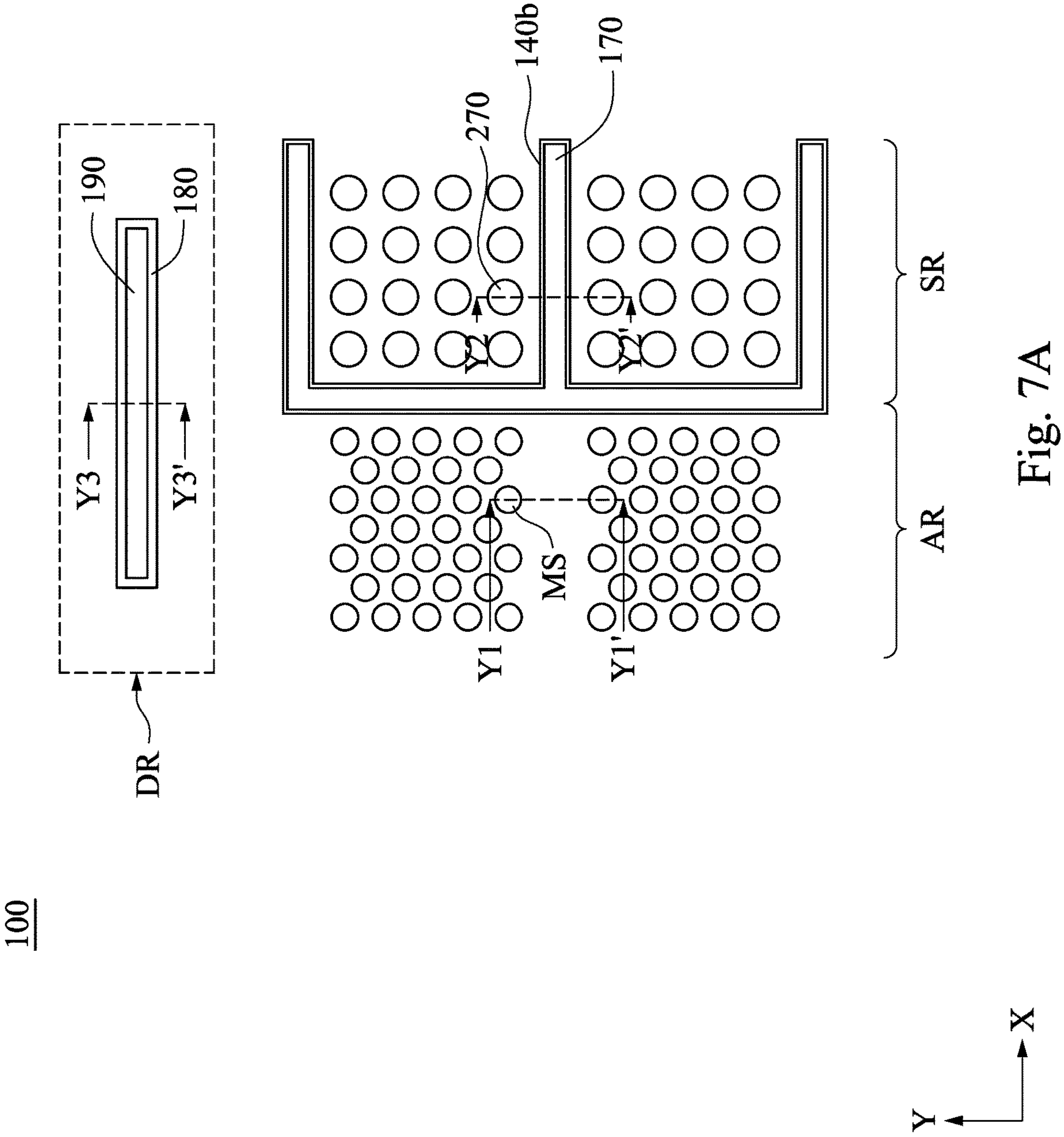
Figure 7B:
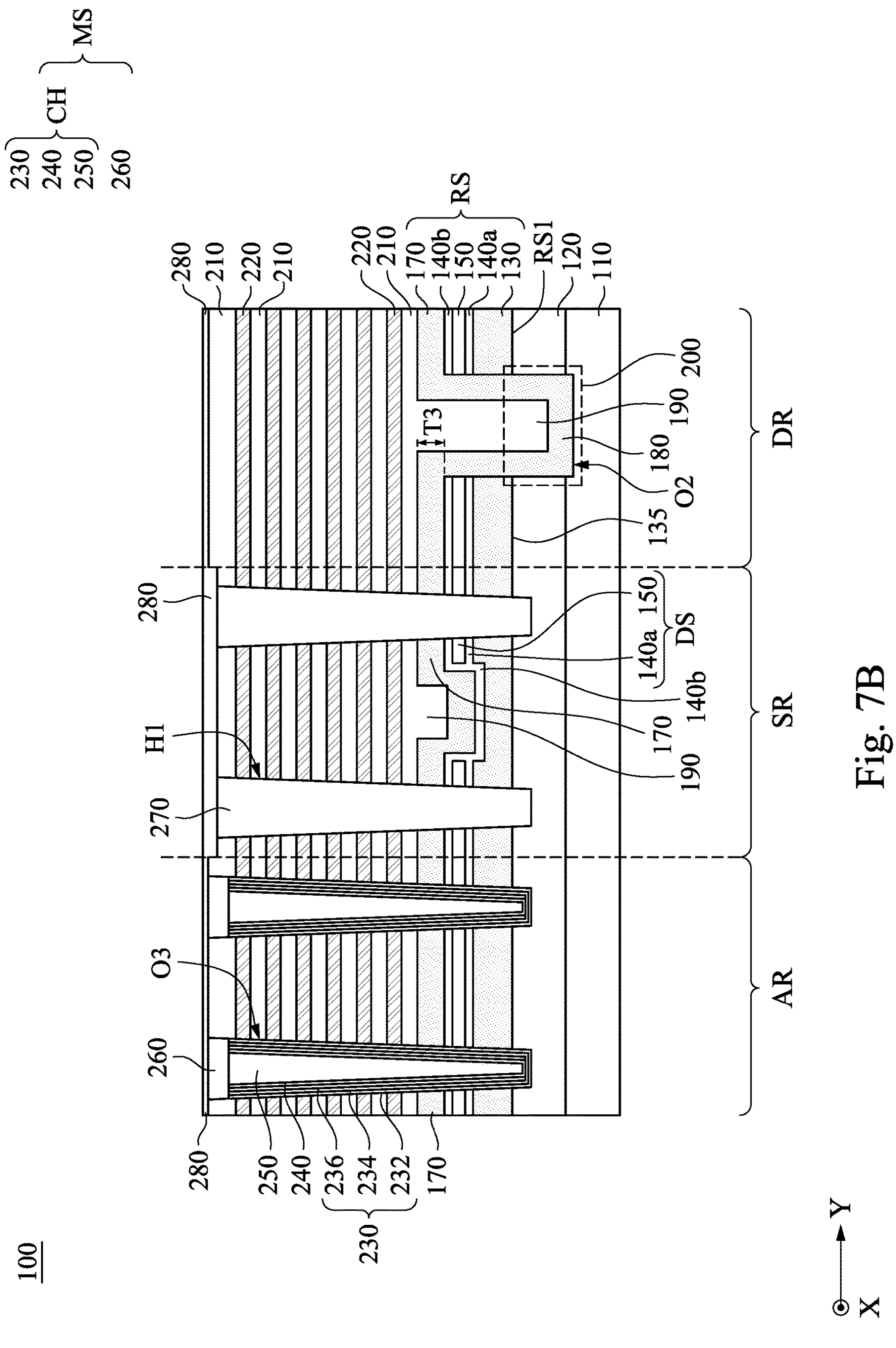

FIG. 7A is a top view of a step of manufacturing the memory device 100, and FIG. 7B is a cross-sectional view of the memory device 100 including the array region AR, the staircase region SR, and the discharge region DR respectively taken along line Y1-Y1', line Y2-Y2', and line Y3-Y3' in FIG. 7A. Referring to FIGS. 7A and 7B, a plurality of insulating layers 210 and a plurality of sacrificial material layers 220 are formed interlaced and stacked over the second conductive layer 170. The insulating layers 210 and the sacrificial material layers 220 are alternately arranged or stacked over the second conductive layer 170, and a bottommost layer of the insulating layers 210 closest to the second conductive layer 170 is in direct contact with the second conductive layer 170. In some embodiments, the insulating layers 210 and the sacrificial material layers 220 include different dielectric materials. For example, the insulating layers 210 include oxide (e.g., silicon oxide), and the sacrificial material layers 220 include nitride (e.g., silicon nitride).

After forming the insulating layers 210 and the sacrificial material layers 220, a plurality of memory structures MS are formed downwards penetrating through the insulating layers 210, the sacrificial material layers 220, the second conductive layer 170, the dielectric material **140*b*, the dielectric stack DS and the first conductive layer 130 in the array region AR. In some embodiments, each of the memory structures MS has a portion embedded in the insulating layer 120. Each of the memory structures MS includes a channel structure CH and a conductive plug 260 on the channel structure CH. Each of the channel structures CH includes a memory element 230, a channel layer 240, and the dielectric filling structure 250. The memory elements 230 are in contact with the insulating layers 210, the sacrificial material layers 220, the second conductive layer 170, the dielectric material 140*b*, the dielectric stack DS, the first conductive layer 130 and the insulating layer 120. The channel layers 240 are in contact with the memory elements 230, and the channel layers 240 are disposed between the memory elements 230 and the dielectric filling structures 250. In some embodiments, each of the memory elements 230 includes a blocking layer 232, a memory storage layer 234, and a tunneling layer 236. The blocking layers 232 are formed using a conformal deposition method such that the blocking layers 232 line the insulating layers 210, the sacrificial material layers 220, the second conductive layer 170, the dielectric material 140*b*, the dielectric stack DS, the first conductive layer 130, and the insulating layer 120. The memory storage layers 234 are formed on the blocking layers 232, and the tunneling layers 236 are formed on the memory storage layers 234. The blocking layers 232 and the tunneling layers 236 may include oxide (e.g., silicon oxide) or other suitable dielectric materials, and the memory storage layers 234 may include nitride (e.g., silicon nitride) or other material that is able to trap electrons. Accordingly, each of the memory elements 230 may be a tri-layer structure of an oxide layer, a nitride layer, and an oxide layer. The channel layers 240 may include polysilicon or other suitable semiconductor materials. The dielectric filling structures 250 may include oxide (e.g., silicon oxide) or other suitable dielectric materials. The conductive plugs 260 may include polysilicon or other suitable semiconductor materials. The conductive plugs 260 and the channel layers 240** may include the same conductive material, such as semiconductor materials or polysilicon.

In some embodiments, forming the memory structures MS include following steps. A plurality of openings O3 are formed downwards penetrating through the insulating layers 210, the sacrificial material layers 220, the second conductive layer 170, the dielectric material **140*b*, the dielectric stack DS, and the first conductive layer 130 in the array region AR such that the insulating layer 120 is exposed. The memory elements 230 (including the blocking layers 232, the memory storage layers 234, and the tunneling layers 236) are formed respectively in the openings O3, the channel layers 240 are then formed over the memory elements 230, and the dielectric filling structures 250 are then formed over the channel layers 240. As a result, the channel structures CH are formed. The channel structures CH are etched back, and the conductive plugs 260** are formed over the respective channel structures CH. As such, the memory structures MS are formed.

With respect to the staircase region SR, a plurality of support pillar structures 270 are formed downwards penetrating through the insulating layers 210, the sacrificial material layers 220, the second conductive layer 170, the dielectric material **140*b*, the dielectric stack DS, and the first conductive layer 130. In greater details, the insulating layers 210, the sacrificial material layers 220, the second conductive layer 170, the dielectric material 140***b*, the dielectric stack DS, and the first conductive layer 130 in the staircase region SR are etched in advance to form holes H1 exposing the insulating layer 120. Then, dielectric materials are filled in the holes H1 to form the support pillar structures 270. In some embodiments, each of the support pillar structures 270 has a portion embedded in the insulating layer 120. In some embodiments, the support pillar structures 270 include oxide (e.g., silicon oxide) or other suitable dielectric materials. In some embodiments, forming the memory structures MS is performed prior to forming the support pillar structures 270. In some embodiments, as shown in FIG. 7A, each of the memory structures MS has a circular top profile, and each of the support pillar structures 270 has a circular top profile. In some embodiments, as shown in FIG. 7A, a diameter of each of the support pillar structures 270 is greater than a diameter of each of the memory structures MS.

Thereafter, an insulating layer 280 is formed on the topmost layer of the insulating layers 210. In some embodiments, the support pillar structures 270 and the insulating layer 280 may be formed together using a single deposition process. In other words, the support pillar structures 270 and the insulating layer 280 include the same dielectric material. In some embodiments, the support pillar structures 270 and the insulating layer 280 include oxide (e.g., silicon oxide) or other suitable dielectric materials. In some embodiments, the support pillar structures 270, the insulating layer 280, and the insulating layers 210 include the same dielectric material, such as oxide.

In some embodiments, the first conductive layer 130, the dielectric stack DS, the dielectric material 140*b*, and the second conductive layer 170 are referred as a reference structure RS (or also referred as a buried source structure). As discussed above with respect to FIG. 5B, the discharge electrode 180 is below and connected to the first conductive layer 130 in the discharge region DR. The discharge electrode 180 extends downwards from a bottom surface 135 of the first conductive layer 130 of the reference structure RS and in electrical contact with the reference structure RS.

Figure 17:
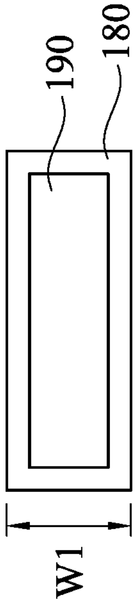
FIG. 17 is a top view of a discharge electrode according to some embodiments of the present disclosure.
Figure 18:
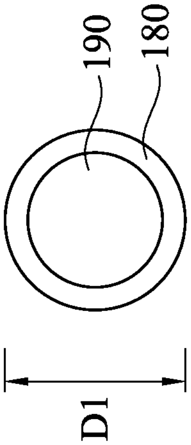
FIG. 18 is a top view of a discharge electrode according to some embodiments of the present disclosure.

Now referring to FIGS. 17 and 18, FIG. 17 is a top view of the discharge electrode 180 according to some embodiments of the present disclosure, and FIG. 18 is a top view of the discharge electrode 180 according to some embodiments of the present disclosure. FIG. 17 and FIG. 18 illustrate different top views with respect to a region 200 (including the discharge electrode 180 and the insulating structures 190) of FIG. 7B. As shown in FIG. 17, the insulating structure 190 has a rectangular top profile, and the discharge electrode 180 has a rectangular ring shape top profile that surrounds the insulating structure 190. In some embodiments, as shown in FIG. 7B and FIG. 17, the second conductive layer 170 has a thickness T3 and the discharge electrode 180 has a width W1, in which a ratio of the thickness T3 of the second conductive layer 170 to the width W1 of the discharge electrode 180 is larger than 2. As shown in FIG. 18, the insulating structure 190 has a circular top profile, and the discharge electrode 180 has a circular ring shape top profile that surrounds the insulating structure 190. In some embodiments, as shown in FIG. 7B and FIG. 18, the second conductive layer 170 has the thickness T3 and the discharge has a diameter D1, in which a ratio of the thickness T3 of the second conductive layer 170 to the diameter D1 of the discharge electrode 180 is larger than 2.

Figure 19:
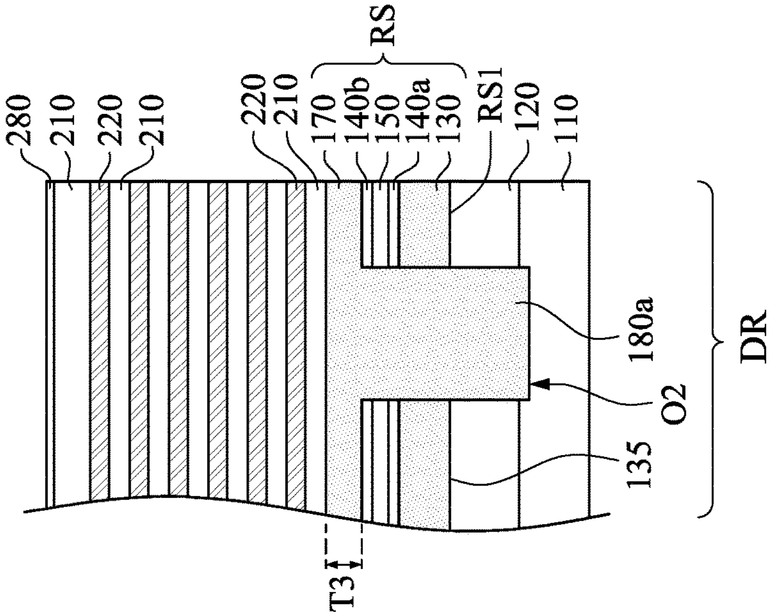
FIG. 19 is a partially cross-sectional view of a discharge electrode in a discharge region according to some embodiments of the present disclosure.

Now referring to FIG. 19, FIG. 19 is a partially cross-sectional view of a discharge electrode 180*a* in the discharge region DR according to some embodiments of the present disclosure. The discharge electrode 180*a* of FIG. 19 is substantially the same as the discharge electrode 180 of FIG. 7B, and the difference is a profile of the discharge electrode 180*a*. As shown in FIG. 19, the discharge electrode 180*a* entirely fills the opening O2 such that there is no insulating structure (i.e., insulating structure 190 in the discharge region DR of FIG. 7B) within or surrounded by the discharge electrode 180*a*.

Figure 20:
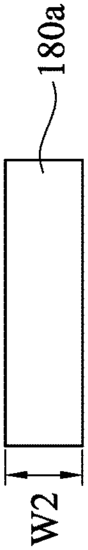
FIG. 20 is a top view of the discharge electrode of FIG. 19 according to some embodiments of the present disclosure.
Figure 21:
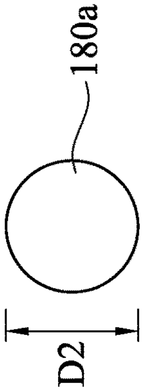
FIG. 21 is a top view of the discharge electrode of FIG. 19 according to some embodiments of the present disclosure.

Now referring to FIGS. 20 and 21, FIG. 20 is a top view of the discharge electrode 180*a* of FIG. 19 according to some embodiments of the present disclosure, and FIG. 21 is a top view of the discharge electrode 180*a* of FIG. 19 according to some embodiments of the present disclosure. FIG. 20 and FIG. 21 illustrate different top views with respect to the discharge electrode 180*a* of FIG. 19. As shown in FIG. 20, the discharge electrode 180 has a rectangular top profile. In some embodiments, as shown in FIG. 19 and FIG. 20, the second conductive layer 170 has the thickness T3 and the discharge electrode 180*a* has a width W2, in which a ratio of the thickness T3 of the second conductive layer 170 to the width W2 of the discharge electrode 180*a* is smaller than 2. As shown in FIG. 21, the discharge electrode 180 has a circular top profile. In some embodiments, as shown in FIG. 19 and FIG. 21, the second conductive layer 170 has the thickness T3 and the discharge electrode 180*a* has a diameter D2, in which a ratio of the thickness T3 of the second conductive layer 170 to the diameter D2 of the discharge electrode 180*a* is smaller than 2.

Figure 8A:
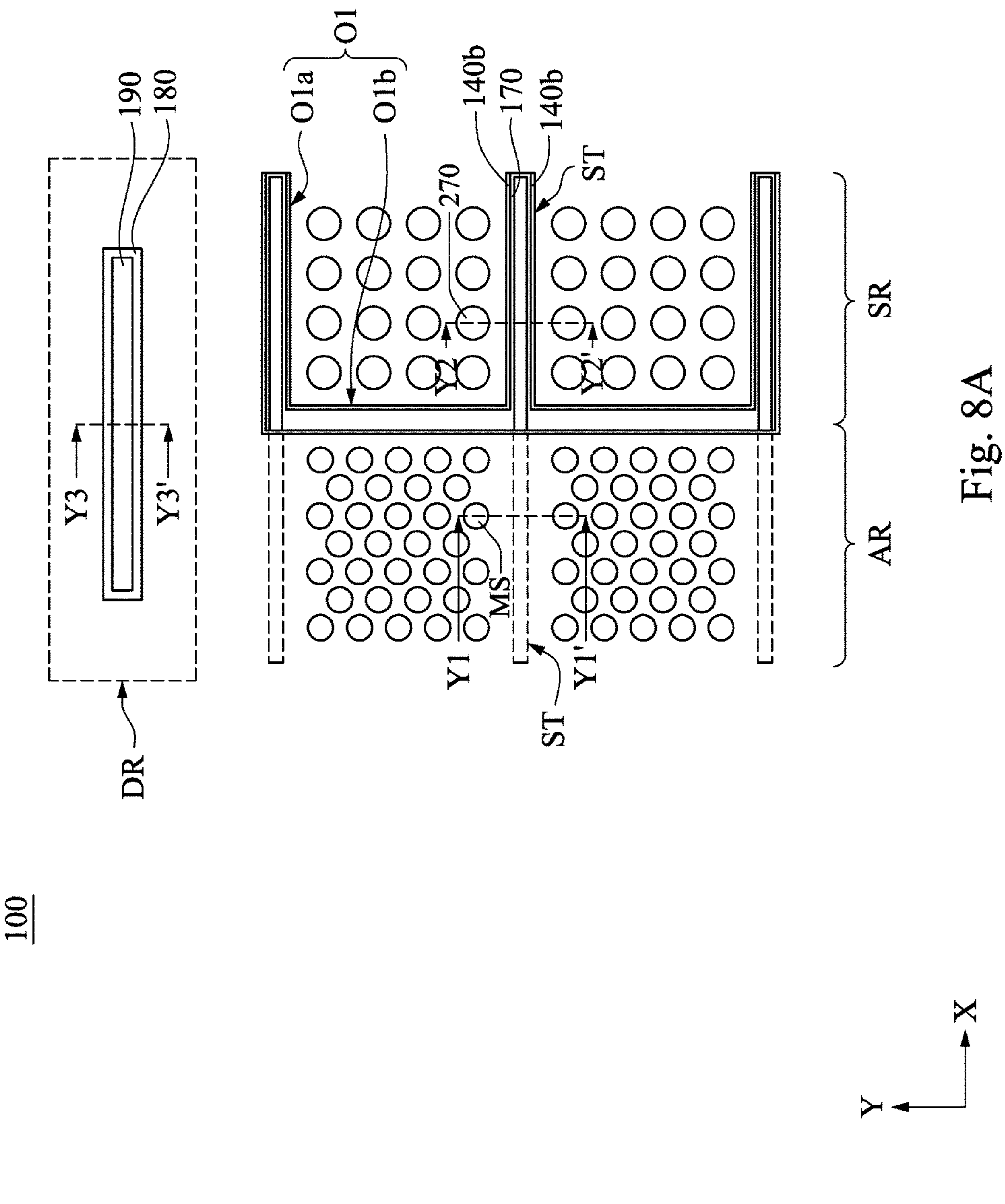
Figure 8B:
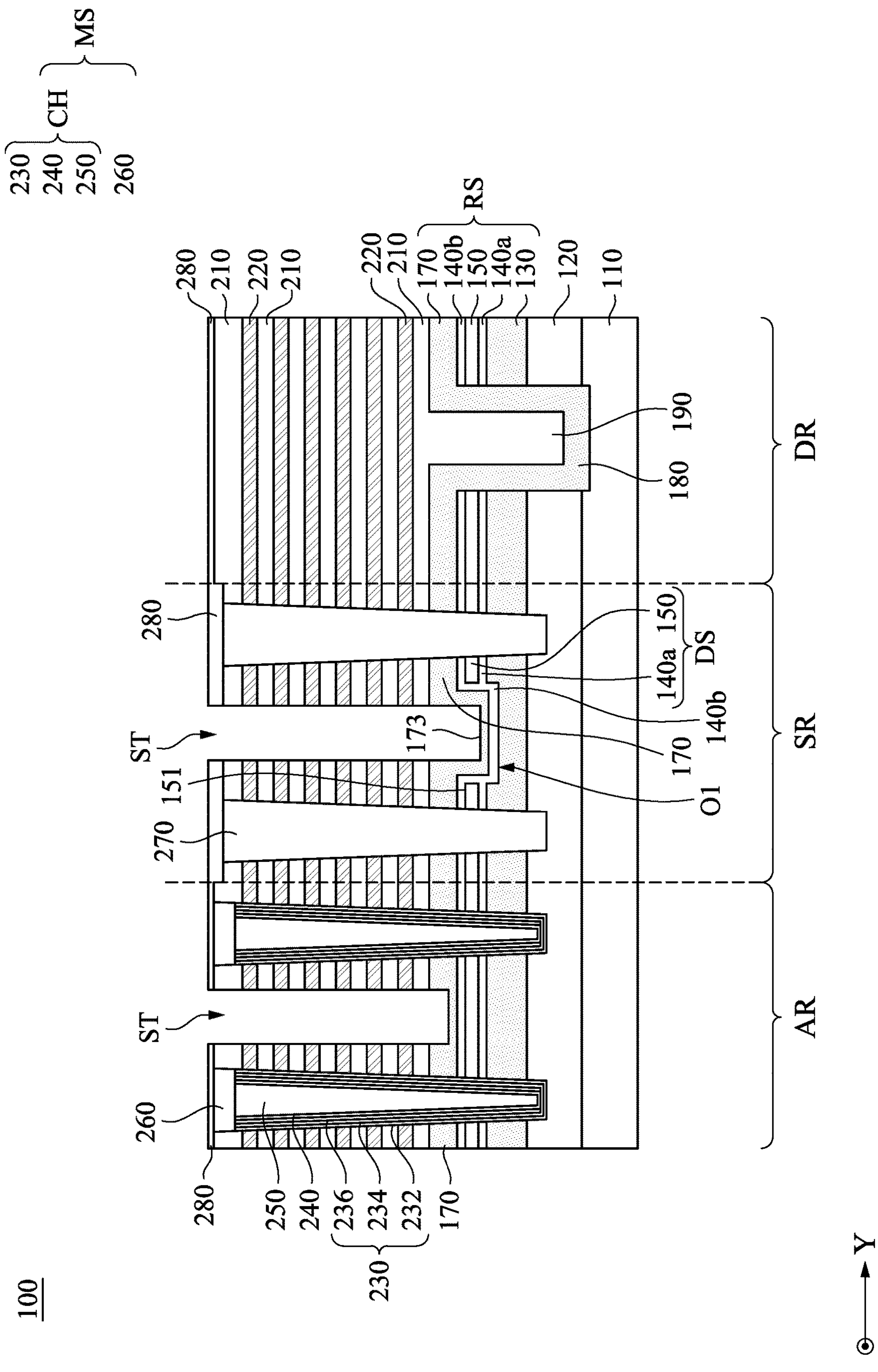

FIG. 8A is a top view of a step of manufacturing the memory device 100, and FIG. 8B is a cross-sectional view of the memory device 100 including the array region AR, the staircase region SR, and the discharge region DR respectively taken along line Y1-Y1', line Y2-Y2', and line Y3-Y3' in FIG. 8A. Referring to FIGS. 8A and 8B, the insulating layers 210, the sacrificial material layers 220, and the second conductive layer 170 are etched to form slit trenches ST downwards penetrating through the insulating layers 210, the sacrificial material layers 220, and the second conductive layer 170 in the array region AR and the staircase region SR. The slit trenches ST expose the second conductive layer 170 in the array region AR and the staircase region SR. In some embodiments, an exposed surface 173 of the second conductive layer 170 is below a topmost surface of the dielectric material 140*b* in the staircase region SR. Further, the exposed surface 173 of the second conductive layer 170 is below a top surface of the dielectric layer 150 in the staircase region SR. In some embodiments, forming the slit trenches ST further includes removing an entirety of the insulating structure 190 in the staircase region SR. In some embodiments, a depth of the slit trenches ST in the array region AR is smaller than a depth of the slit trenches ST in the staircase region SR.

In some embodiments, as shown in FIG. 8A, each of the slit trenches ST extends between the array region AR and the staircase region SR and extends along the first direction X. In some embodiments, as discussed above with respect to FIG. 1A, the opening O1 corresponding to a bottom of the dielectric material 140*b* includes the first portions O1*a* along the first direction X and the second portion O1*b* along the second direction Y. The slit trenches ST are parallel with and overlap with the respective first portions O1*a* of the opening O1. The second portion O1*b* of the opening O1 is disposed between the memory structures MS and the support pillar structures 270.

Figure 9A:
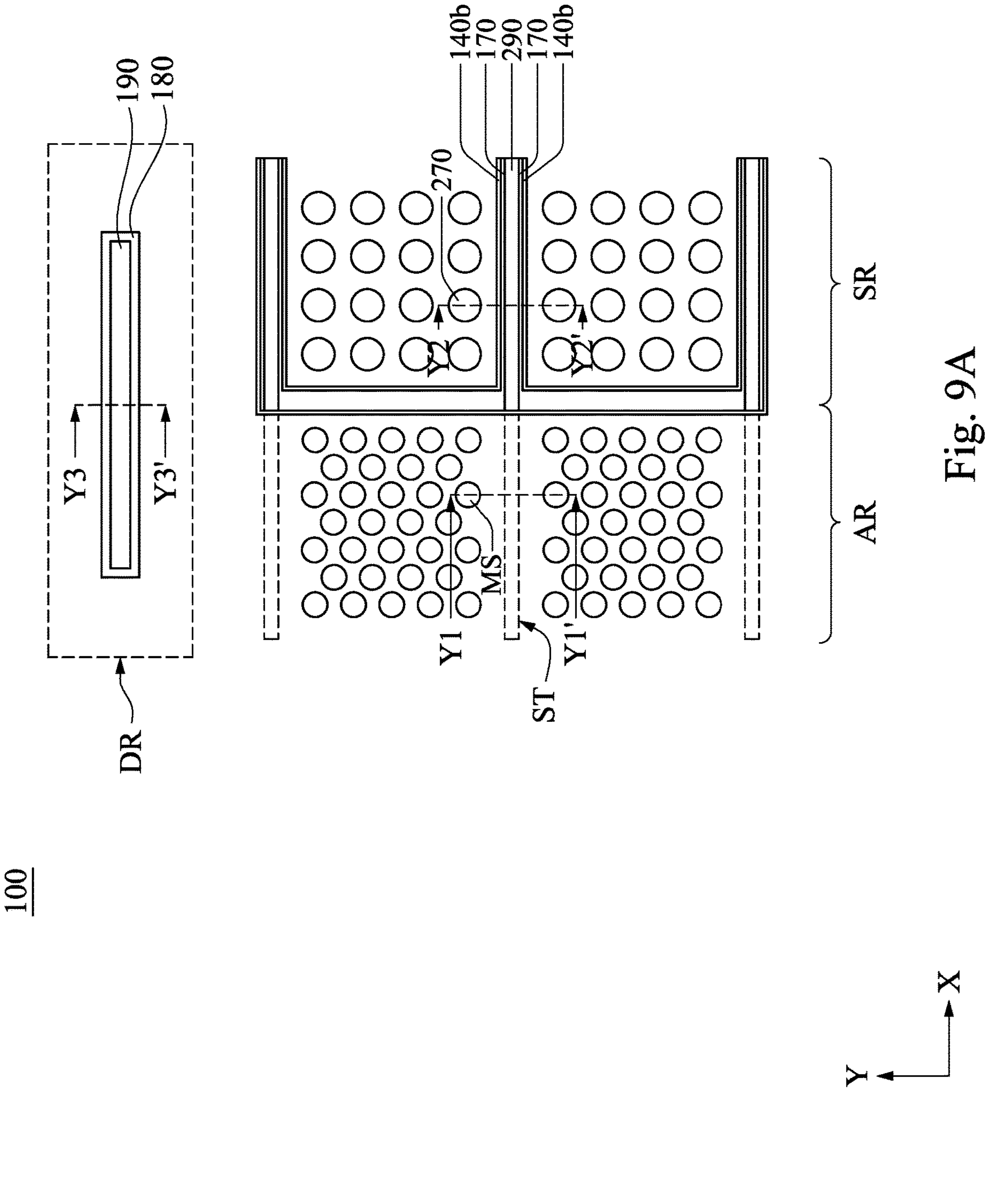
Figure 9B:
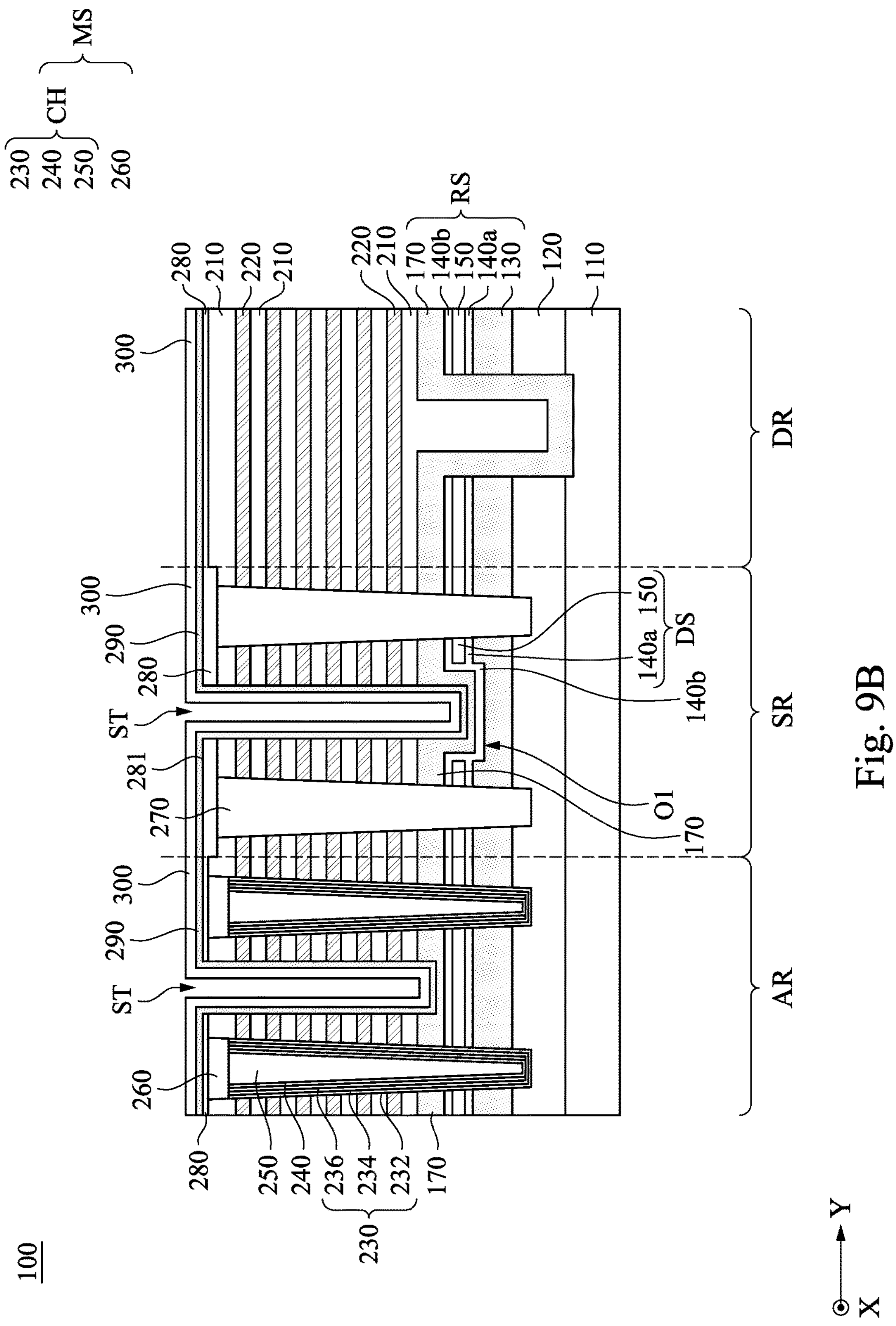

FIG. 9A is a top view of a step of manufacturing the memory device 100, and FIG. 9B is a cross-sectional view of the memory device 100 including the array region AR, the staircase region SR, and the discharge region DR respectively taken along line Y1-Y1', line Y2-Y2', and line Y3-Y3' in FIG. 9A. Referring to FIGS. 9A and 9B, a protective layer 290 is conformally formed on the structure of FIGS. 8A and 8B. In greater details, the protective layer 290 is formed using a conformal deposition method such that the protective layer 290 lines the insulating layer 280, the insulating layers 210, the sacrificial material layers 220 and the second conductive layer 170 in the array region AR and the staircase region SR. After forming the protective layer 290, a spacer layer 300 is formed conformally on the protective layer 290. The protective layer 290 and the spacer layer 300 are configured to prevent the sidewalls of the slit trenches ST (e.g., the sidewalls of the insulating layers 210 and the sidewalls of the sacrificial material layers 220) from damaging in subsequent etching processes (e.g., etching process of the dielectric stack DS and dielectric material 140*b* in FIGS. 12A-13B). In some embodiments, the protective layer 290, the second conductive layer 170 and/or the first conductive layer 130 include the same conductive material. In some embodiments, the spacer layer 300 and the protective layer 290 includes different material. For example, the protective layer 290 includes semiconductor materials (e.g., polysilicon), and the spacer layer 300 includes the dielectric materials (e.g., oxide). In some embodiments, the spacer layer 300 and the insulating layer 280 include the same dielectric material.

Figure 10A:
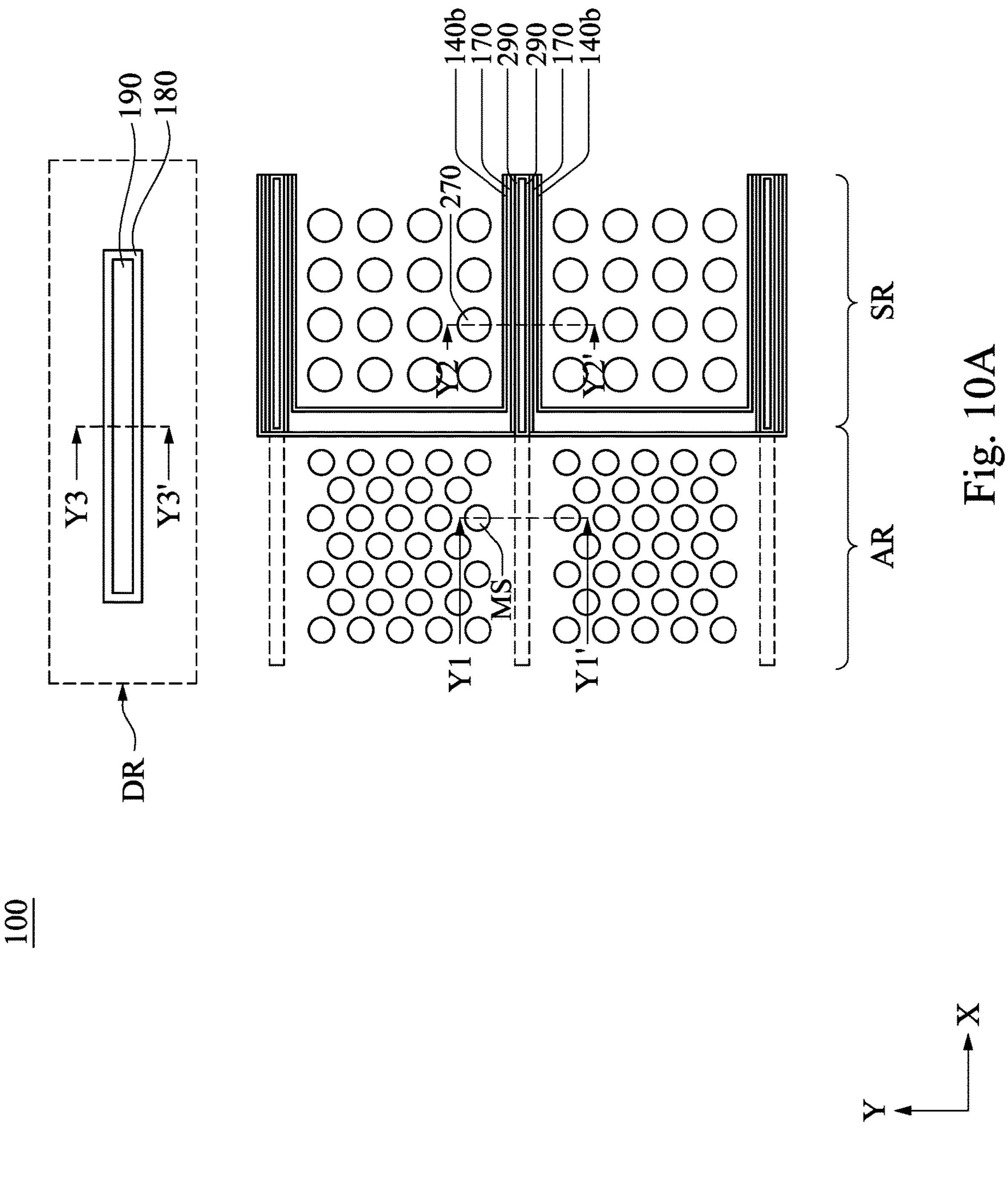
Figure 10B:
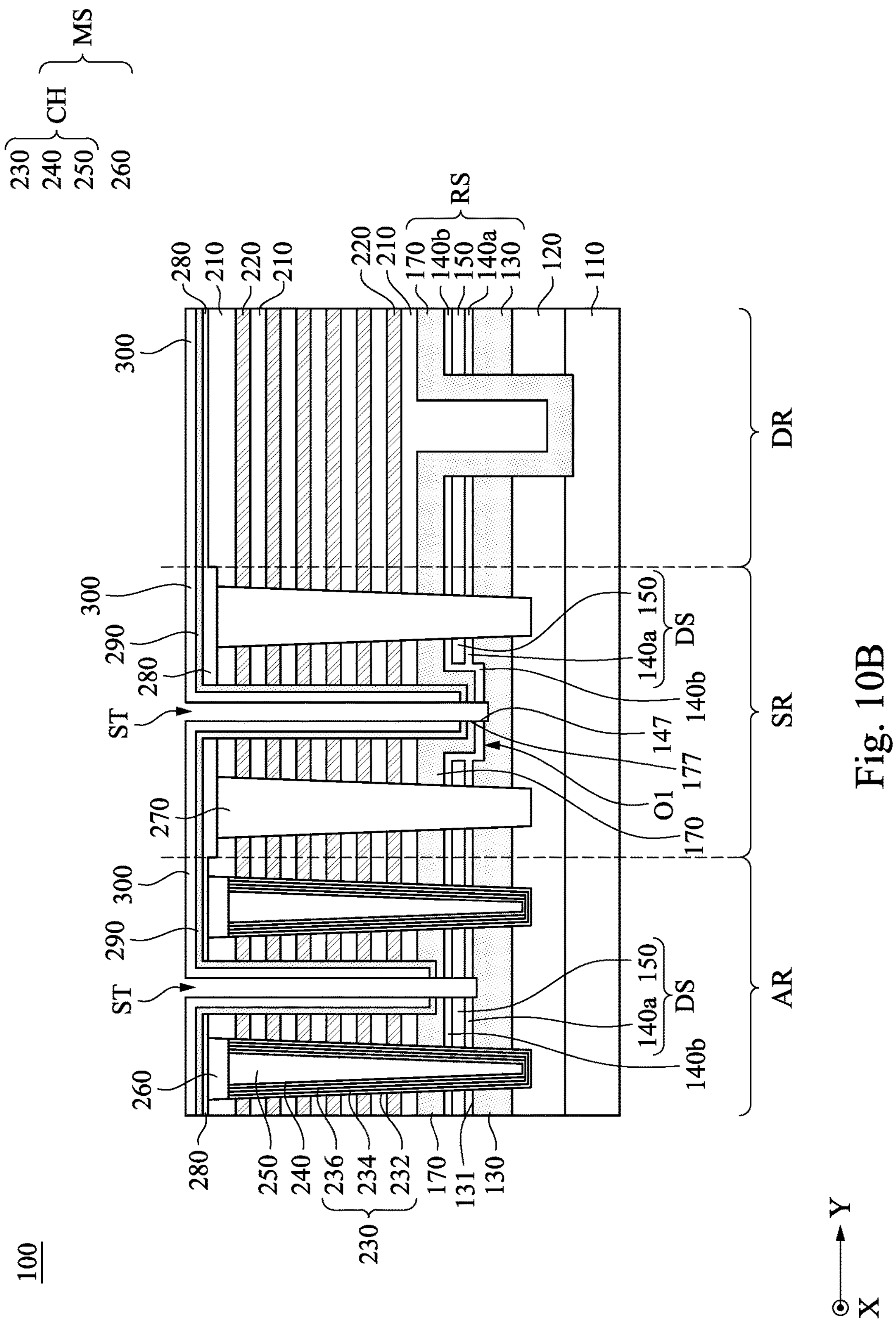

FIG. 10A is a top view of a step of manufacturing the memory device 100, and FIG. 10B is a cross-sectional view of the memory device 100 including the array region AR, the staircase region SR, and the discharge region DR respectively taken along line Y1-Y1', line Y2-Y2', and line Y3-Y3' in FIG. 10A. Referring to FIGS. 10A and 10B, after forming the protective layer 290 and the spacer layer 300, one or more etching processes are performed to further extend (or deepen) the slit trenches ST such that the first conductive layer 130 is exposed. With respect to the array region AR, the spacer layer 300, the protective layer 290, the second conductive layer 170, the dielectric material 140*b* and the dielectric stack DS (the dielectric layers 140*a* and 150) are etched from the slit trenches ST, and the etching process(es) may be stopped at the first conductive layer 130. With respect to the staircase region SR, the spacer layer 300, the protective layer 290, the second conductive layer 170 and the dielectric material 140*b* are etched from the slit trenches ST, and the etching process(es) may be stopped at the first conductive layer 130. In some embodiments, a portion of the first conductive layer 130 in the array region AR and/or the staircase region SR is etched such that an exposed surface of the first conductive layer 130 is below the topmost surface 131 of the first conductive layer 130.

In some embodiments, the slit trenches ST expose sidewalls of the dielectric material 140*b* and sidewalls of the dielectric stack DS (i.e., the dielectric layer 140*a* and 150) in the array region AR. Further, the slit trenches ST expose sidewalls 177 of the second conductive layer 170 and sidewalls 147 of the dielectric material 140*b* in the staircase region SR. In some embodiments, the one or more etching processes of deepening the slit trenches ST are performed by using a dry etching process, a wet etching process, or a combination thereof. Since the dielectric material 140*b* covering the sidewall of the dielectric stack DS and the second conductive layer 170 on the dielectric material 140*b* in the staircase region SR protect the adjacent dielectric stack DS, the dielectric stack DS in the staircase region SR is not exposed (i.e., covered by the dielectric material 140*b* and the second conductive layer 170) during deepening the slit trenches ST. Further, a damage of the support pillar structure 270 during etching the dielectric stack DS (i.e., the etching processes in FIGS. 12A-12C and 13A-13B) will be avoided or prevented, thereby avoiding deformation or collapse problems.

Figure 11A:
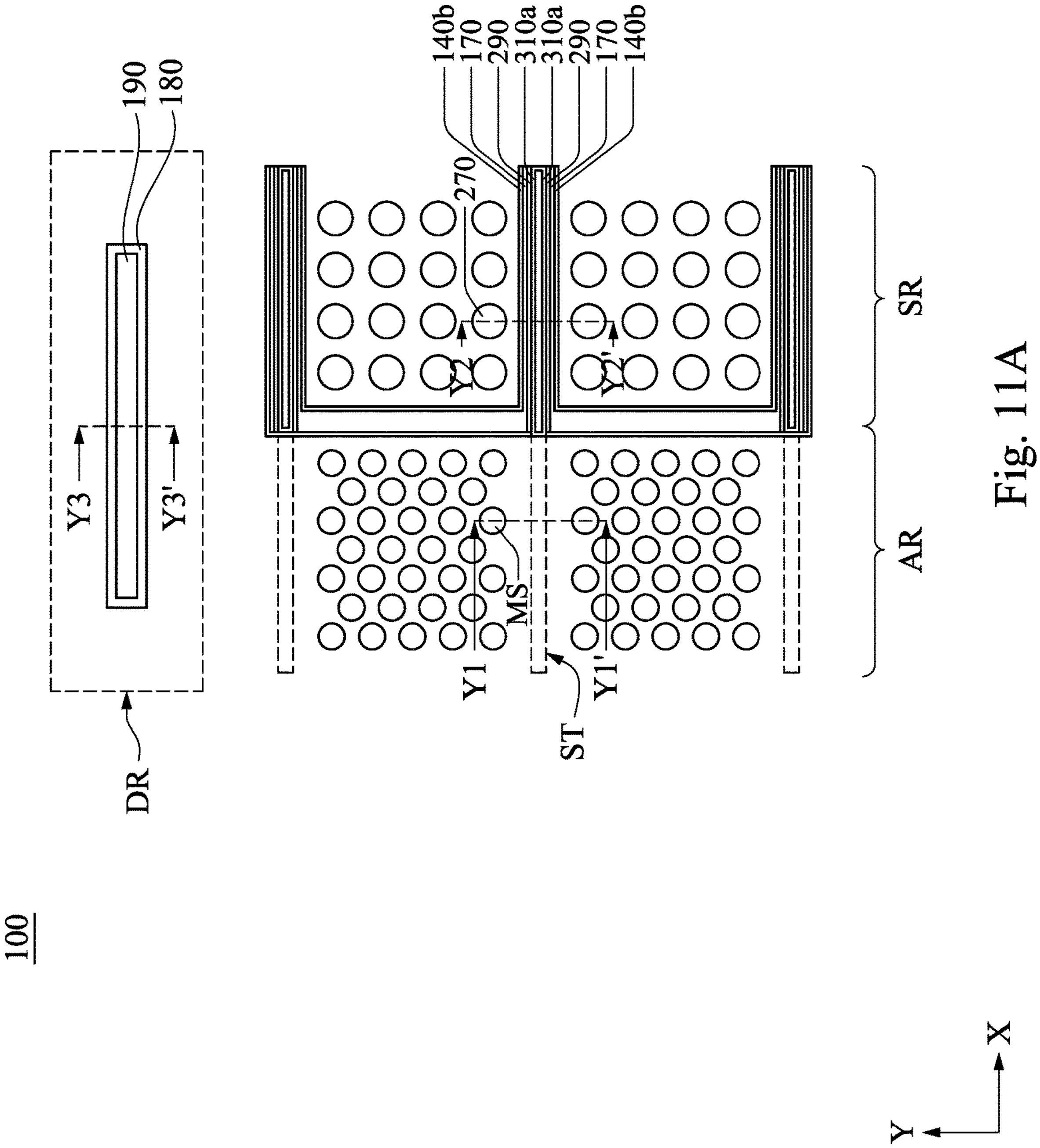
Figure 11B:
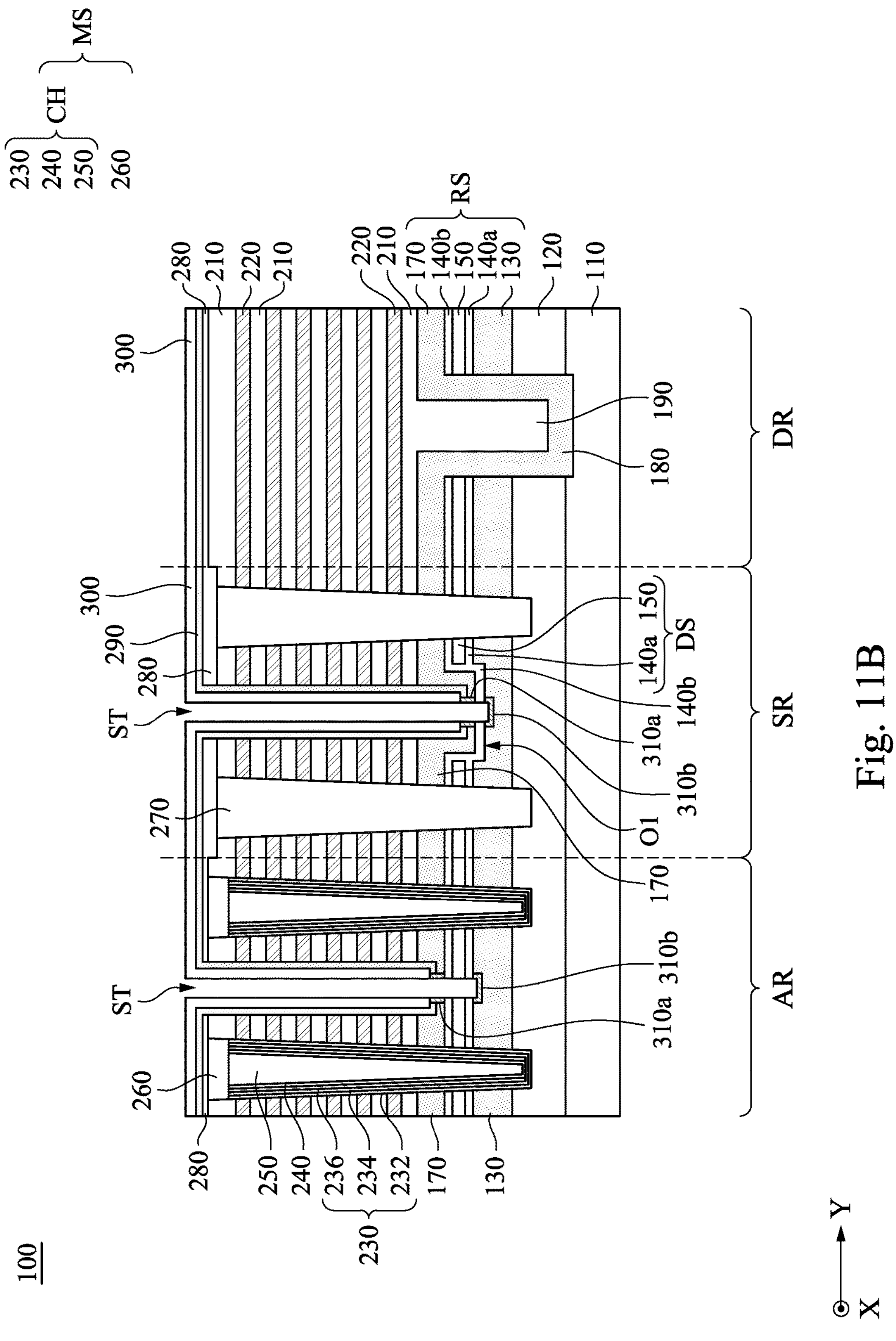

FIG. 11A is a top view of a step of manufacturing the memory device 100, and FIG. 11B is a cross-sectional view of the memory device 100 including the array region AR, the staircase region SR, and the discharge region DR respectively taken along line Y1-Y1', line Y2-Y2', and line Y3-Y3' in FIG. 11A. Referring to FIGS. 11A and 11B, a selectively oxidation process is performed on an exposed portion of the protective layer 290, an exposed portion of the second conductive layer 170, and an exposed portion of the first conductive layer 130 through the slit trenches ST in the array region AR and the staircase region SR to form oxide structures 310*a* and 310*b*. In greater details, the selectively oxidation process is performed to selective oxidize semiconductor material (e.g., polysilicon). The exposed portions of the semiconductor material layers (i.e., the protective layer 290, the second conductive layer 170, and the first conductive layer 130) are oxidized and are converted to the oxide structures 310*a* and 310*b* including semiconductor oxide (e.g., silicon oxide). On the other hand, exposed portions of the spacer layer 300, the dielectric layer 140*a*, the dielectric layer 150, and the dielectric material 140*b* are not oxidized since the spacer layer 300, the dielectric layer 140*a*, the dielectric layer 150, and the dielectric material 140*b* include dielectric material. In some embodiments, the oxide structure 310*a* covers the exposed portion of the protective layer 290 and the exposed portion of the second conductive layer 170 adjacent to the slit trenches ST. Similarly, the oxide structure 310*b* covers the exposed portion of the first conductive layer 130 adjacent to the slit trenches ST. In some embodiments, the selectively oxidation process includes wet or dry thermal oxidation in an ambient including an oxide, $H_2O$, NO, combinations thereof, or the like. In some embodiments, the selectively oxidation process includes an in-situ steam generation (ISSG) process in an ambient environment of oxide, $H_2O$, NO, combinations thereof, or the like.

Figure 12A:
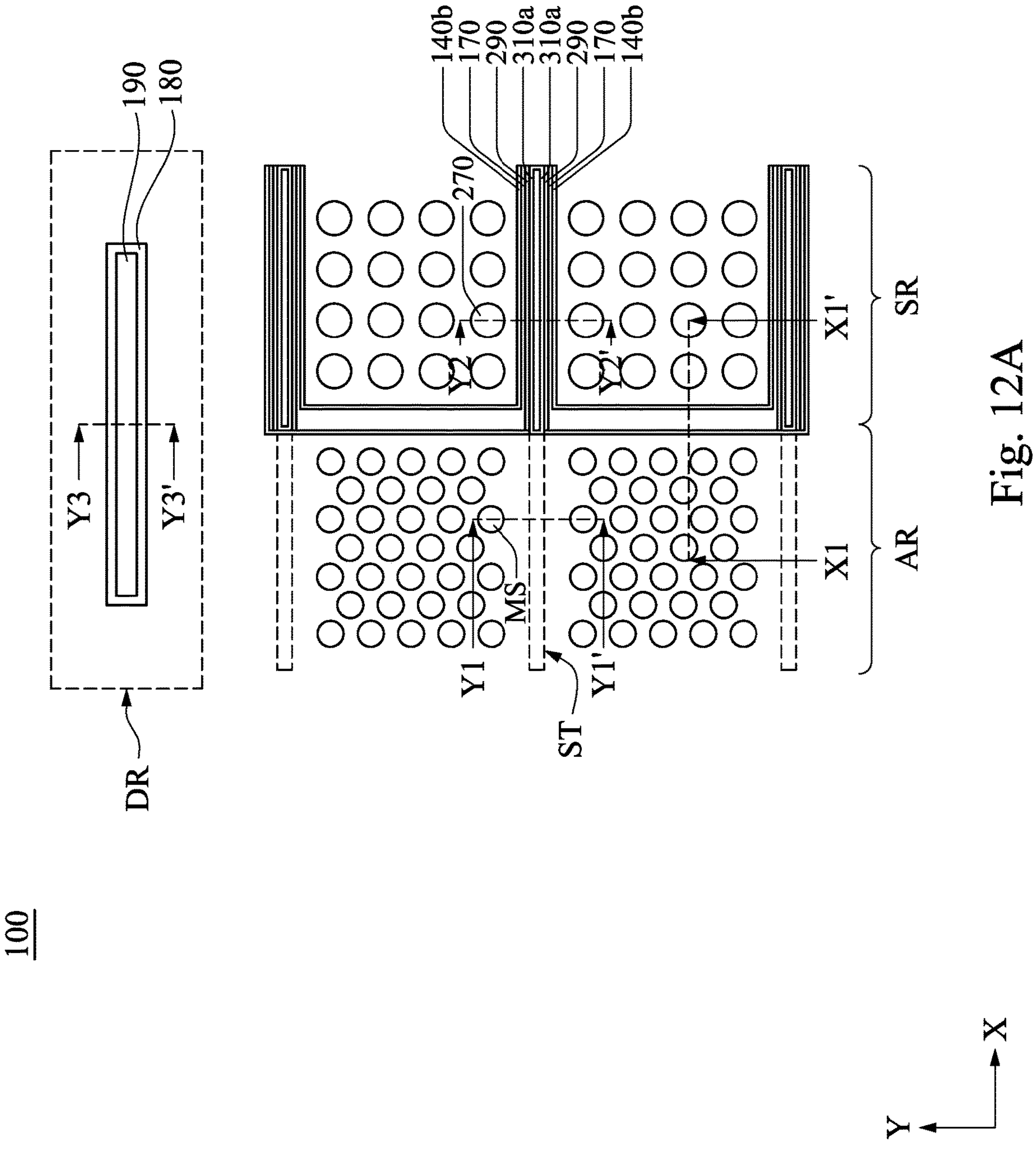
Figure 12B:
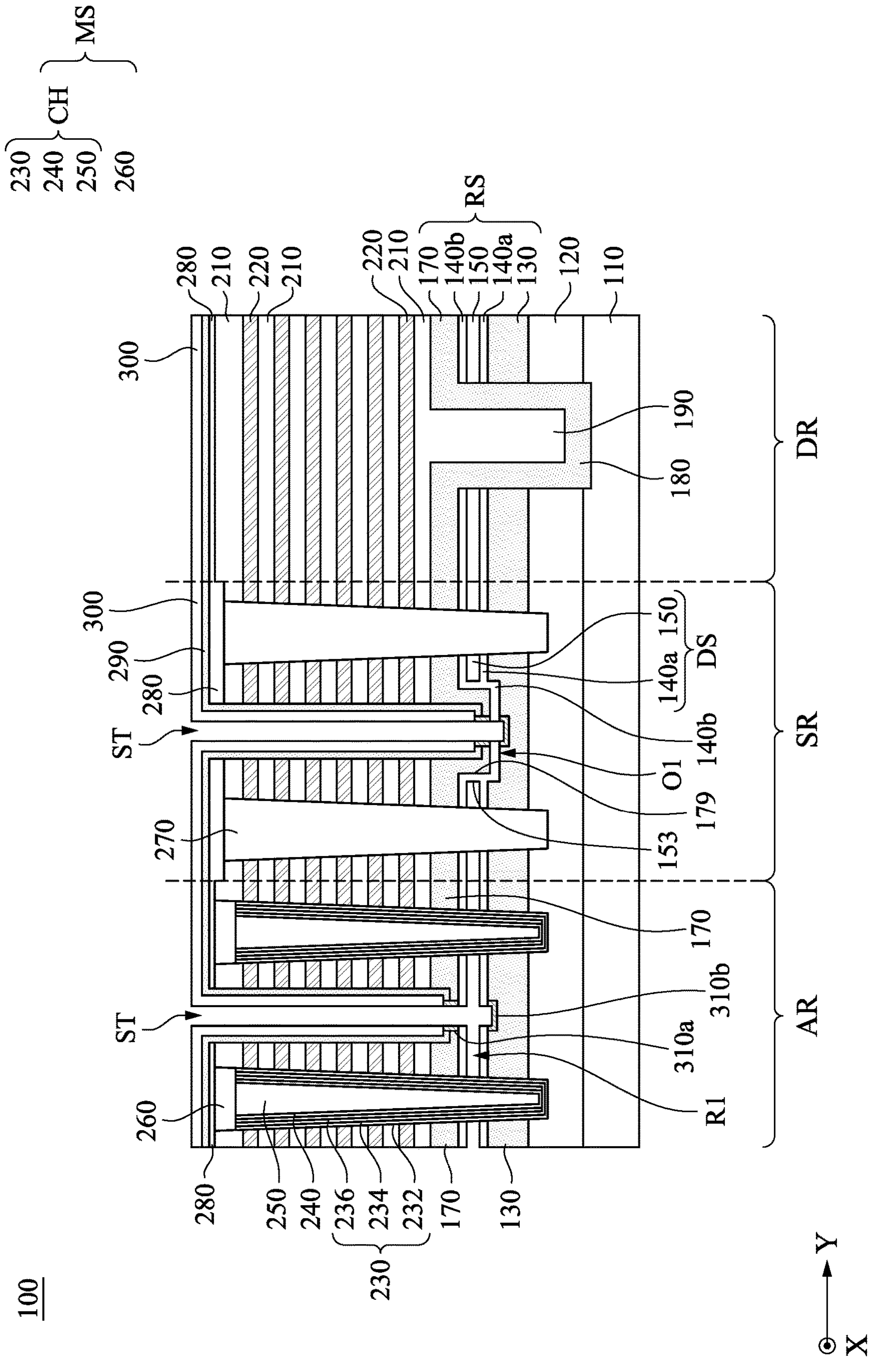
Figure 12C:
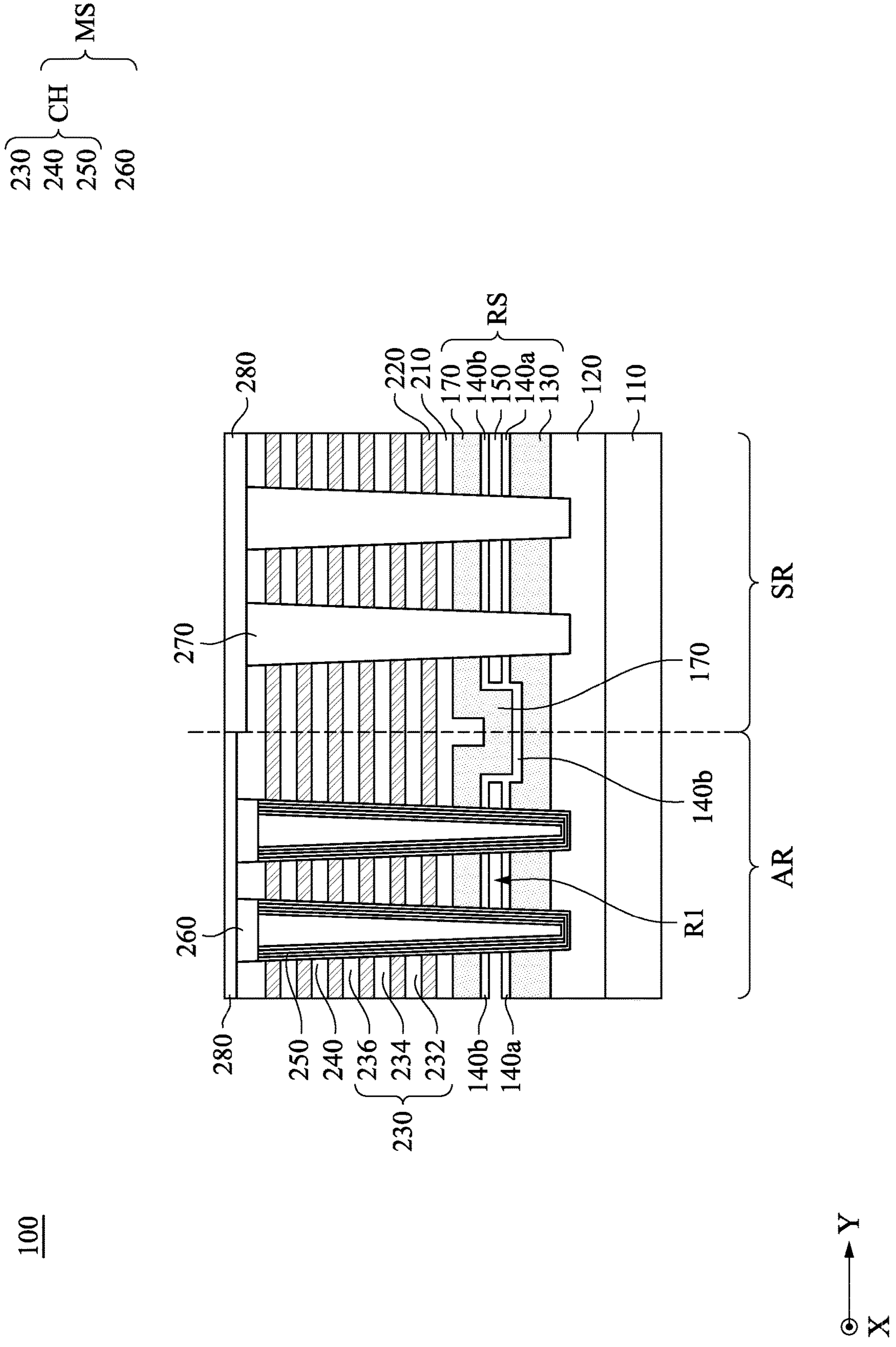
FIG. 12C is a cross-sectional view taking along line X1-X1' of FIG. 12A.

FIG. 12A is a top view of a step of manufacturing the memory device 100, FIG. 12B is a cross-sectional view of the memory device 100 including the array region AR, the staircase region SR, and the discharge region DR respectively taken along line Y1-Y1', line Y2-Y2', and line Y3-Y3' in FIG. 12A, and FIG. 12C is a cross-sectional view taking along line X1-X1' of FIG. 12A. Referring to FIGS. 11A-11B and 12A-12C, an etching process is performed to remove a portion of the dielectric layer 150 of the dielectric stack DS in the array region AR. In other words, an entirety of the dielectric layer 150 of the dielectric stack DS in the array region AR is removed to form a recess R1 communicated with the slit trenches ST. In some embodiments, the dielectric layer 150 has lower etching resistance to the etching process than the dielectric layer 140*a*, the dielectric material 140*b*, the spacer layer 300 and the oxide structures 310*a*-310*b*. As a result, the dielectric layer 150 is etched and the dielectric layer 140*a*, the dielectric material 140*b*, the spacer layer 300 and the oxide structures 310*a*-310*b* are kept substantially intact (not etched) during the etching process. Further, since the oxide structure 310*a* covers the second conductive layer 170 and the protective layer 290 and the oxide structure 310*b* covers the first conductive layer 130, the damage of the first conductive layer 130, the second conductive layer 170 and the protective layer 290 during the etching process can be avoided. In some embodiments, the recess R1 exposes the dielectric layer 140*a* and the dielectric material 140*b*. In some embodiments, since the dielectric material 140*b* disposed between a sidewall 153 of the dielectric layer 150 and a sidewall 179 of the second conductive layer 170 in the staircase region SR (i.e., the dielectric material 140*b* covers the sidewall of the dielectric layer 150 in the staircase region SR), the dielectric material 140*b* may protect the dielectric layer 150 in the staircase region SR during the etching process. In some embodiments, the etching process of removing the dielectric layer 150 includes a wet etching process, in which the wet etching process may use phosphoric acid solution or other suitable acidic etching solutions.

Figure 13A:
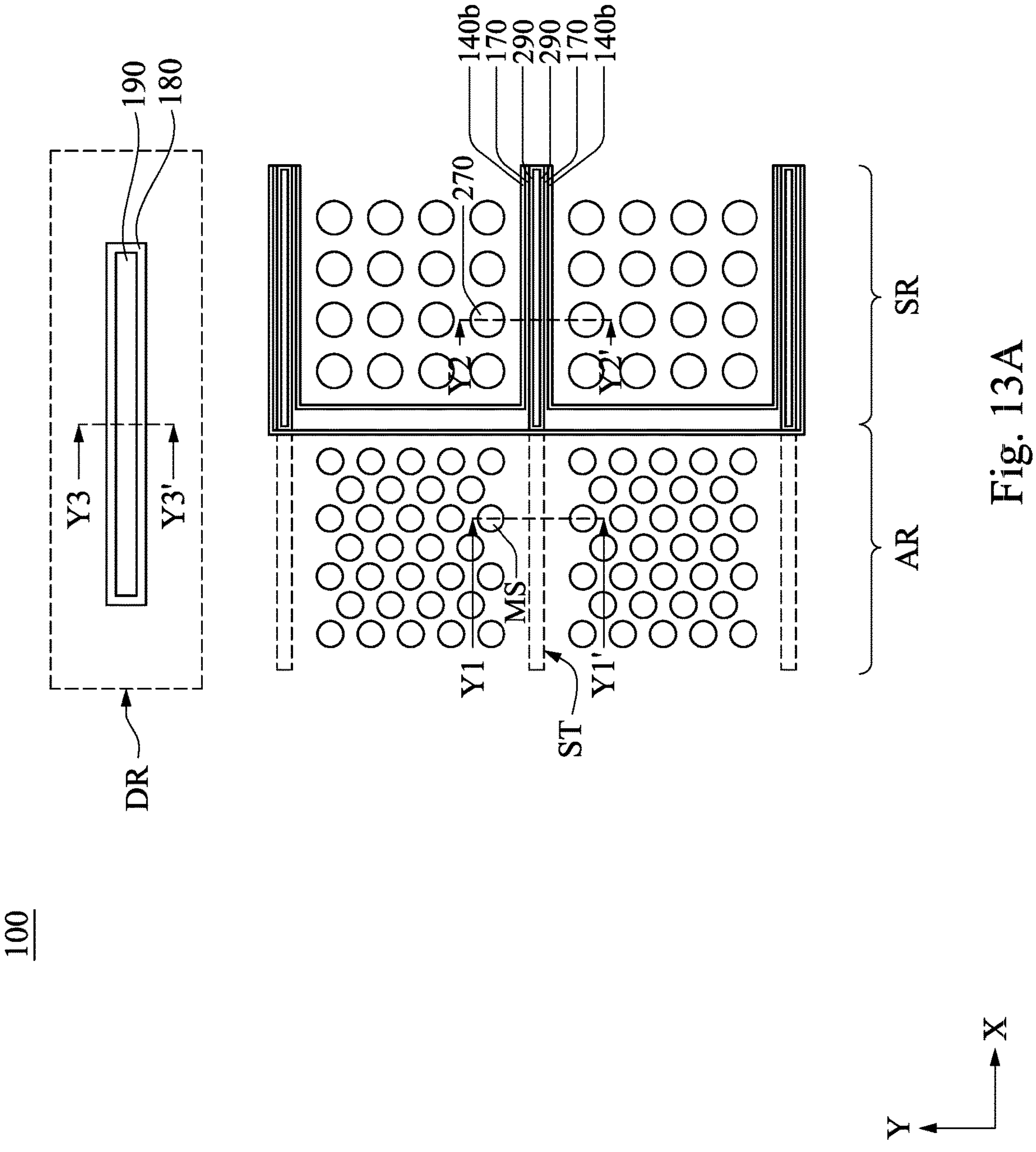
Figure 13B:
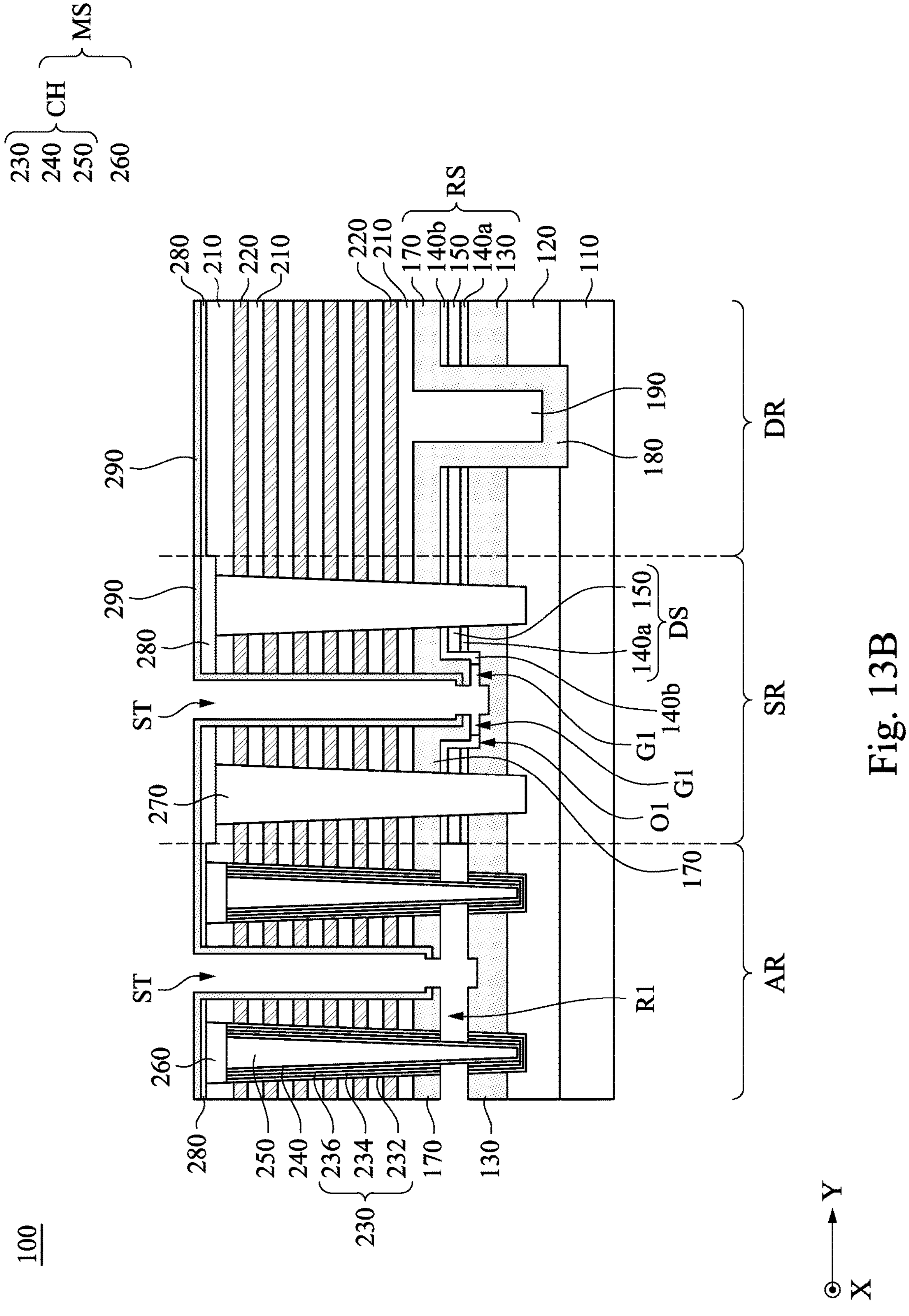

FIG. 13A is a top view of a step of manufacturing the memory device 100, and FIG. 13B is a cross-sectional view of the memory device 100 including the array region AR, the staircase region SR, and the discharge region DR respectively taken along line Y1-Y1', line Y2-Y2', and line Y3-Y3' in FIG. 13A. Referring to FIGS. 13A and 13B, an etching process is performed to remove an entirety of the dielectric layer 140*a* and the dielectric material 140*b* in the array region AR such that the recess R1 is expanded. The etching process further removes the spacer layer 300 and the oxide structures 310*a*-310*b*. In some embodiments, the etching process further removes the memory elements 230 of the memory structures MS through the recess R1 to expose the channel layers 240 of the memory structures MS in the array region AR. In some embodiments, the dielectric layer 140*a*, the dielectric material 140*b*, the spacer layer 300, the oxide structures 310*a*-310*b*, and the memory elements 230 have lower etching resistance to the etching process than the first conductive layer 130, the second conductive layer 170, and the protective layer 290. As a result, the dielectric layer 140*a*, the dielectric material 140*b*, the spacer layer 300, the oxide structures 310*a*-310*b*, and the memory elements 230 are etched and the first conductive layer 130, the second conductive layer 170 and the protective layer 290 are kept substantially intact (not etched) during the etching process. In some embodiments, etchants of the etching process of FIGS. 13A-13B are different from etchants of the etching process of FIGS. 12A-12C. In some embodiments, the recess R1 exposes the first conductive layer 130 and the second conductive layer 170 in the array region AR. In some embodiments, the etching process of removing the dielectric layer 140*a*, the dielectric material 140*b*, the spacer layer 300, the oxide structures 310*a*-310*b*, and the memory elements 230 includes a dry etching process, a wet etching process, or a combination thereof. In some embodiments, since the dielectric layer 140*a*, the dielectric material 140*b*, the spacer layer 300, and the oxide structures 310*a*-310*b* include the same dielectric material (e.g., oxide), they can be removed in a single selective etching process.

As shown in FIGS. 12A-12C and 13A-13B, the dielectric stack DS (i.e., the dielectric layers 140*a* and 150) includes a first portion in the staircase region SR and a second portion in the array region AR, and the dielectric material 140*b* includes a first portion in the staircase region SR and a second portion in the array region AR. The etching processes of FIGS. 12A-12C and 13A-13B are performed to remove the second portion of the dielectric stack DS (i.e., the dielectric layers 140*a* and 150) in the array region AR to expose the memory structures MS, and the first portion of the dielectric stack DS (i.e., the dielectric layers 140*a* and 150) in the staircase region SR remains after the etching processes of FIGS. 12A-12C and 13A-13B are complete. In some embodiments, since the dielectric material 140*b* covers the sidewalls of the dielectric layer 150 and the sidewalls of the dielectric layer 140*a* and the second conductive layer 170 covers a sidewall of the dielectric material 140*b*, the dielectric stack DS (i.e., the dielectric layers 140*a* and 150) in the staircase region SR is kept substantially intact (not etched) during the etching processes of FIGS. 12A-12C and 13A-13B. As a result, the damage of the support pillar structure 270 during the etching processes of FIGS. 12A-12C and 13A-13B can be avoided or prevented, thereby avoiding deformation or collapse problems. Further, the etching processes of FIGS. 12A-12C and 13A-13B are performed to remove the second portion of the dielectric material 140*b* in the array region AR to expose the memory structures MS, and the first portion of the dielectric material 140*b* in the staircase region SR remain after the etching processes are complete. In some embodiments, since the dielectric material 140*b* has lower etching resistance to the etching process than the first conductive layer 130 and the second conductive layer 170, the dielectric material 140*b* in the staircase region SR is laterally etched to form at least one gap G1 vertically between the first conductive layer 130 and the second conductive layer 170.

Figure 14A:
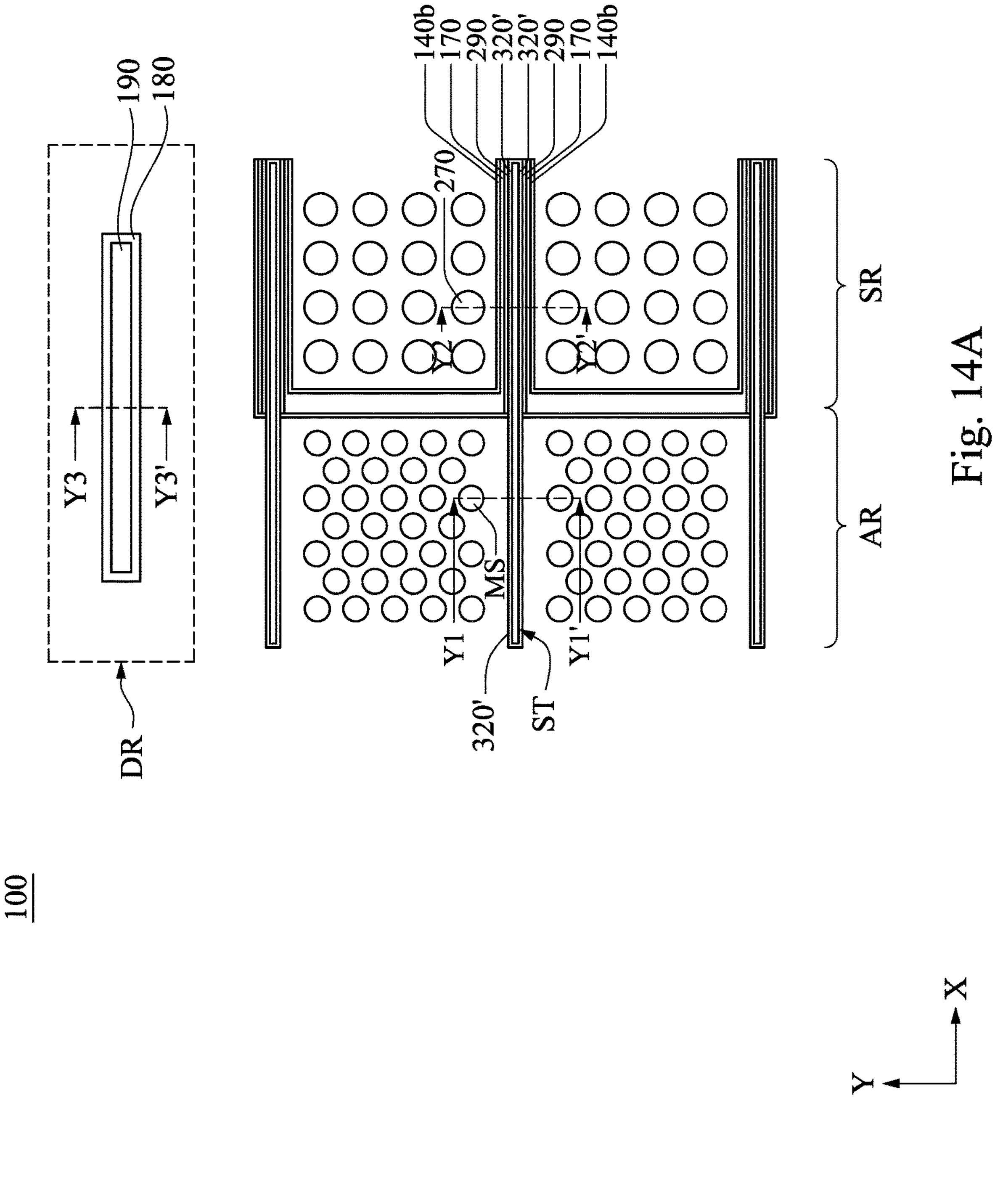
Figure 14B:
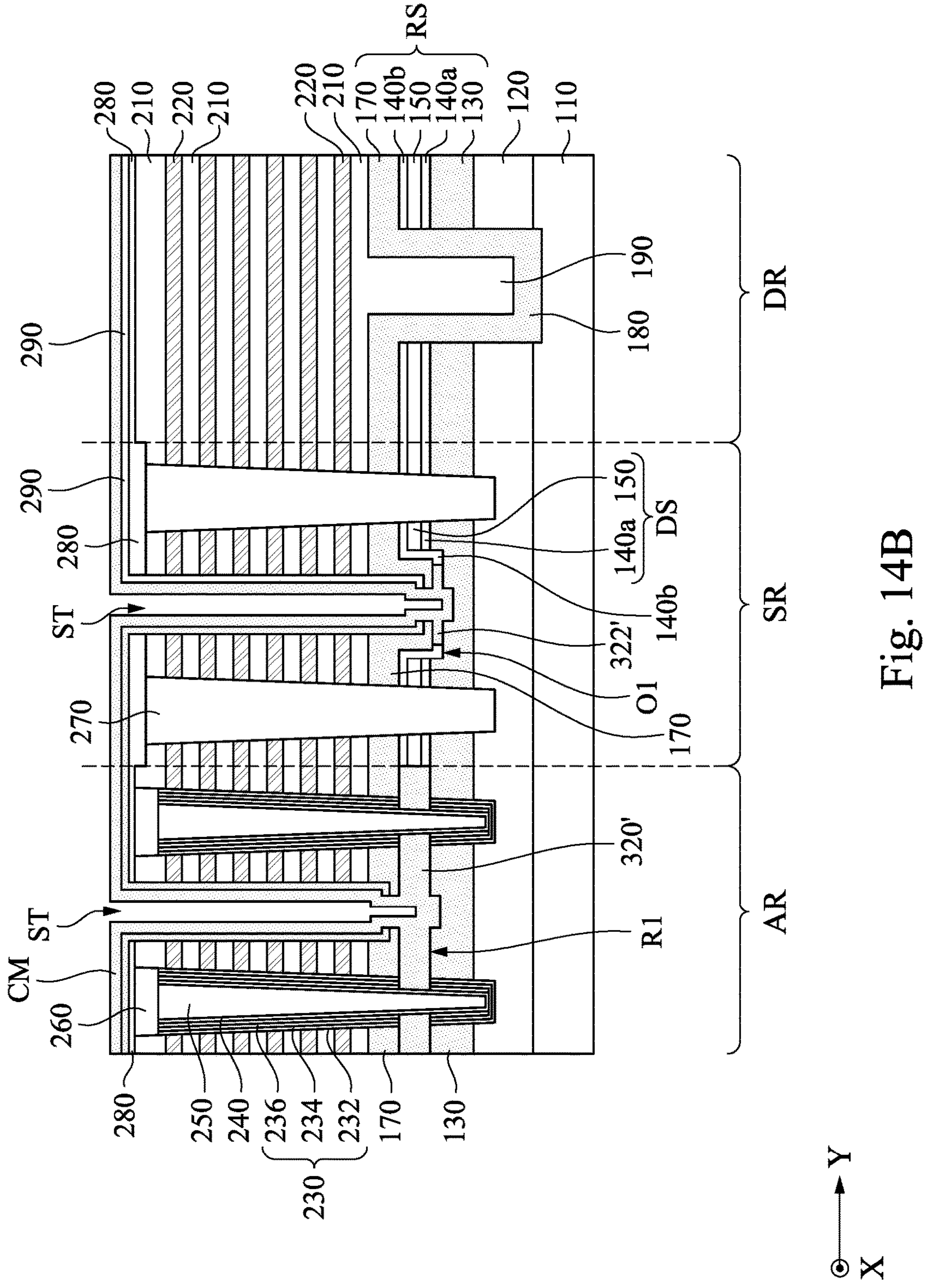

FIG. 14A is a top view of a step of manufacturing the memory device 100, and FIG. 14B is a cross-sectional view of the memory device 100 including the array region AR, the staircase region SR, and the discharge region DR respectively taken along line Y1-Y1', line Y2-Y2', and line Y3-Y3' in FIG. 14A. Referring to FIGS. 14A and 14B, conductive materials CM are formed on the protective layer 290 and the sidewalls of the slit trenches ST. The conductive material CM further include a first portion 320' filled in the recess R1 and a second portion 322' filled in the gap G1 (see FIG. 13B). The first portion 320' is in contact with the memory structures MS in the array region AR and the second portion 322' is in contact with the dielectric material 140*b*. The first portion 320' may be referred as a bottom electrode layer (e.g., bottom electrode layer 320 in FIG. 15B) described in more detail below and the second portion 322' may be referred as a conductive material (e.g., conductive material 322 in FIG. 15B) described in more detail below. In some embodiments, the conductive materials CM include semiconductor materials (e.g., polysilicon). In some embodiments, the conductive materials CM, the protective layer 290, the second conductive layer 170 and/or the first conductive layer 130 include the same conductive material.

Figure 15A:
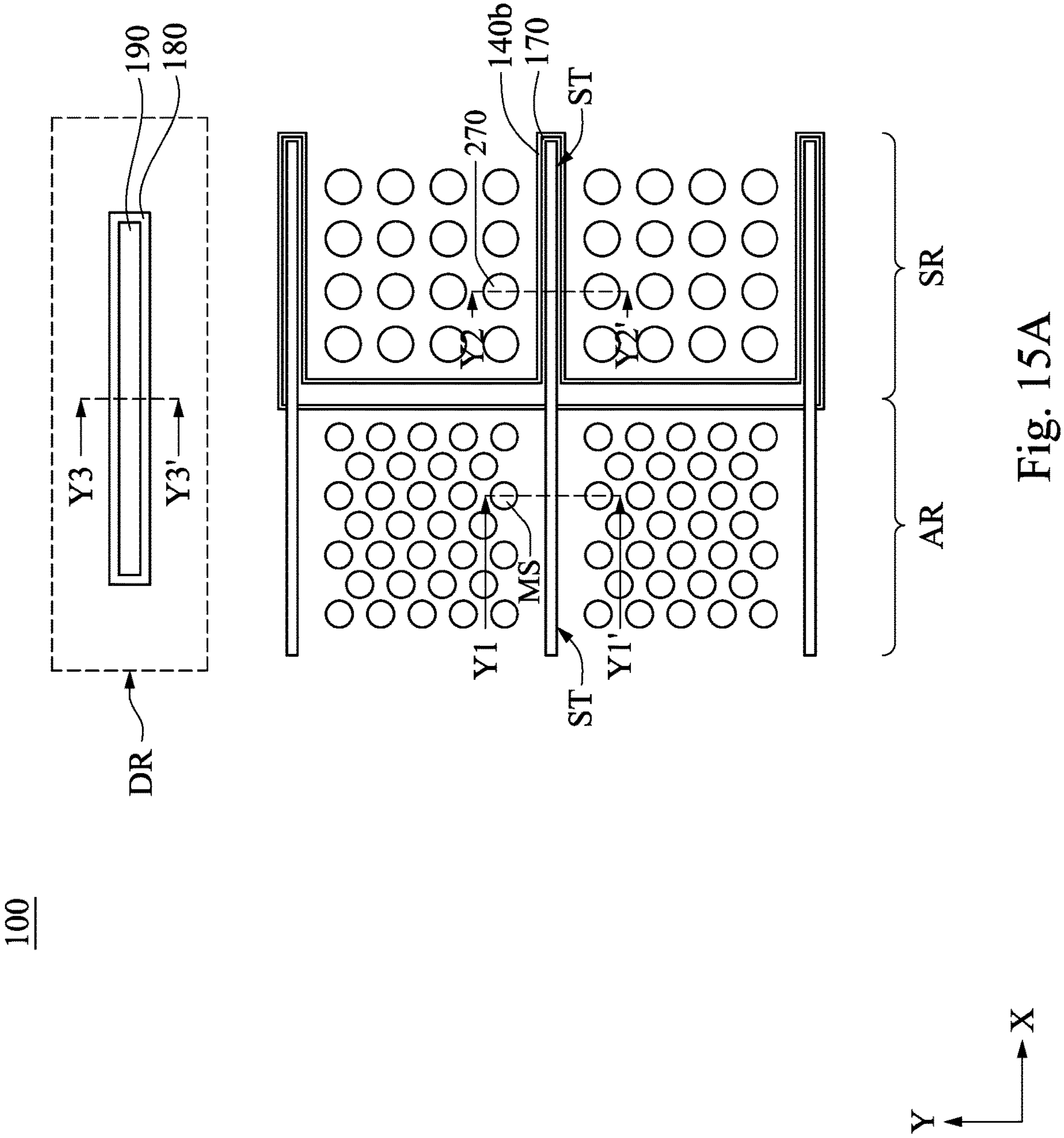
Figure 15B:
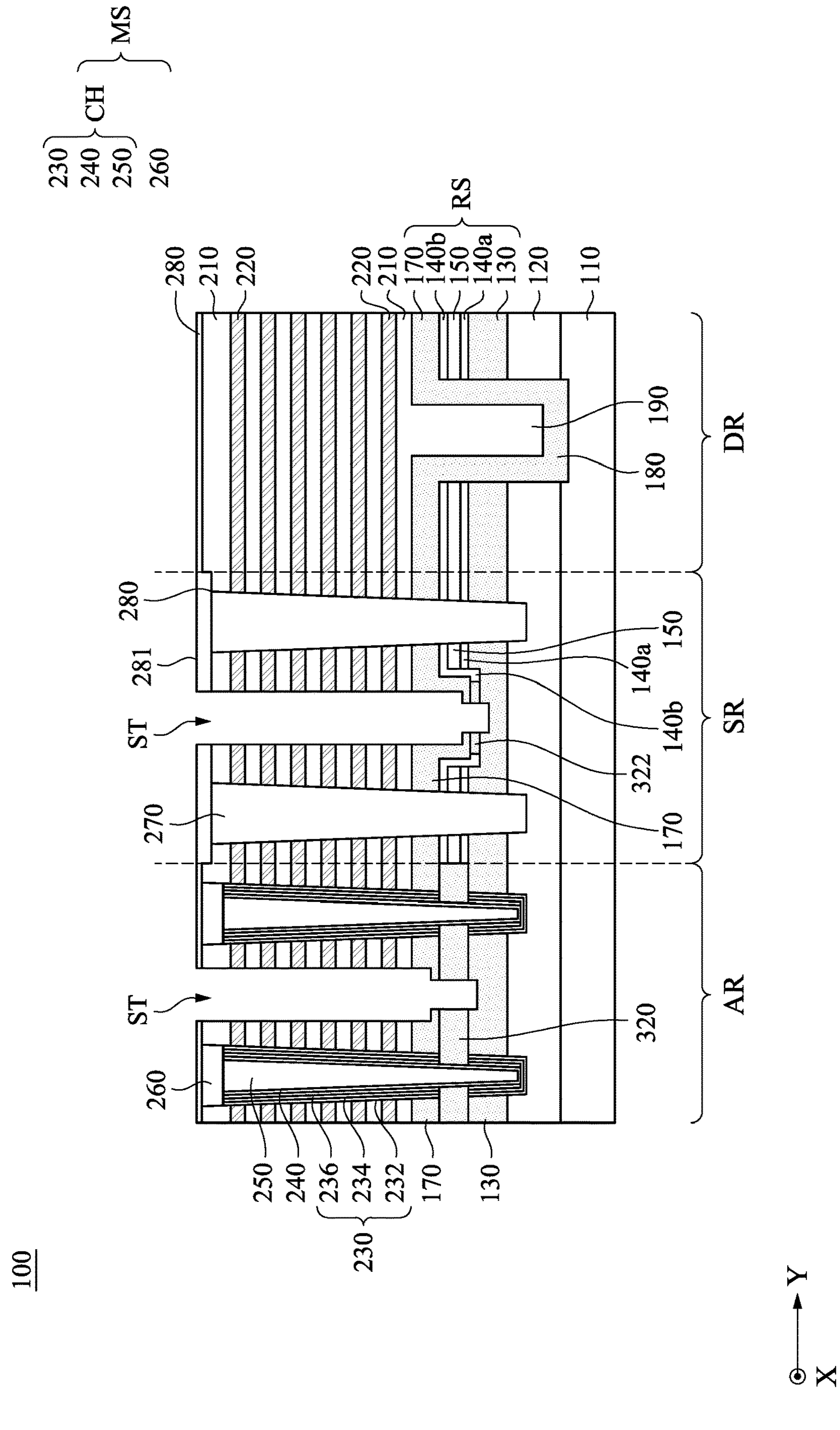

FIG. 15A is a top view of a step of manufacturing the memory device 100, and FIG. 15B is a cross-sectional view of the memory device 100 including the array region AR, the staircase region SR, and the discharge region DR respectively taken along line Y1-Y1', line Y2-Y2', and line Y3-Y3' in FIG. 15A. Referring to FIGS. 14A-14B and 15A-15B, performing an etching process to pattern the conductive materials CM such that the bottom electrode layer 320 is formed (or defined) in electrical contact with the channel layers 240 of the memory structures MS and the conductive material 322 in contact with the dielectric material 140*b*. In greater details, as shown in FIGS. 14B and 15B, the etching process removes portions of the conductive materials CM over the insulating layer 280 and in the slit trenches ST. The etching process further entirely removes the protective layer 290 in the array region AR and the staircase region SR. In some embodiments, after the etching process is complete, the first conductive layer 130 in the array region AR and the staircase region SR is exposed through the slit trenches ST. Further, the top surface 281 of the insulating layer 280, the sidewalls of the insulating layers 210, the sidewalls of the sacrificial material layers 220, and the sidewalls of the second conductive layer 170 in the array region AR and the staircase region SR are exposed. In some embodiments, since the conductive materials CM and the protective layer 290 include the same conductive material (e.g., polysilicon or other suitable semiconductor materials), the conductive materials CM and the protective layer 290 may be removed in a single selective etching process. In some embodiments, the conductive materials CM and the protective layer 290 are removed using a wet etching process.

Figure 16A:
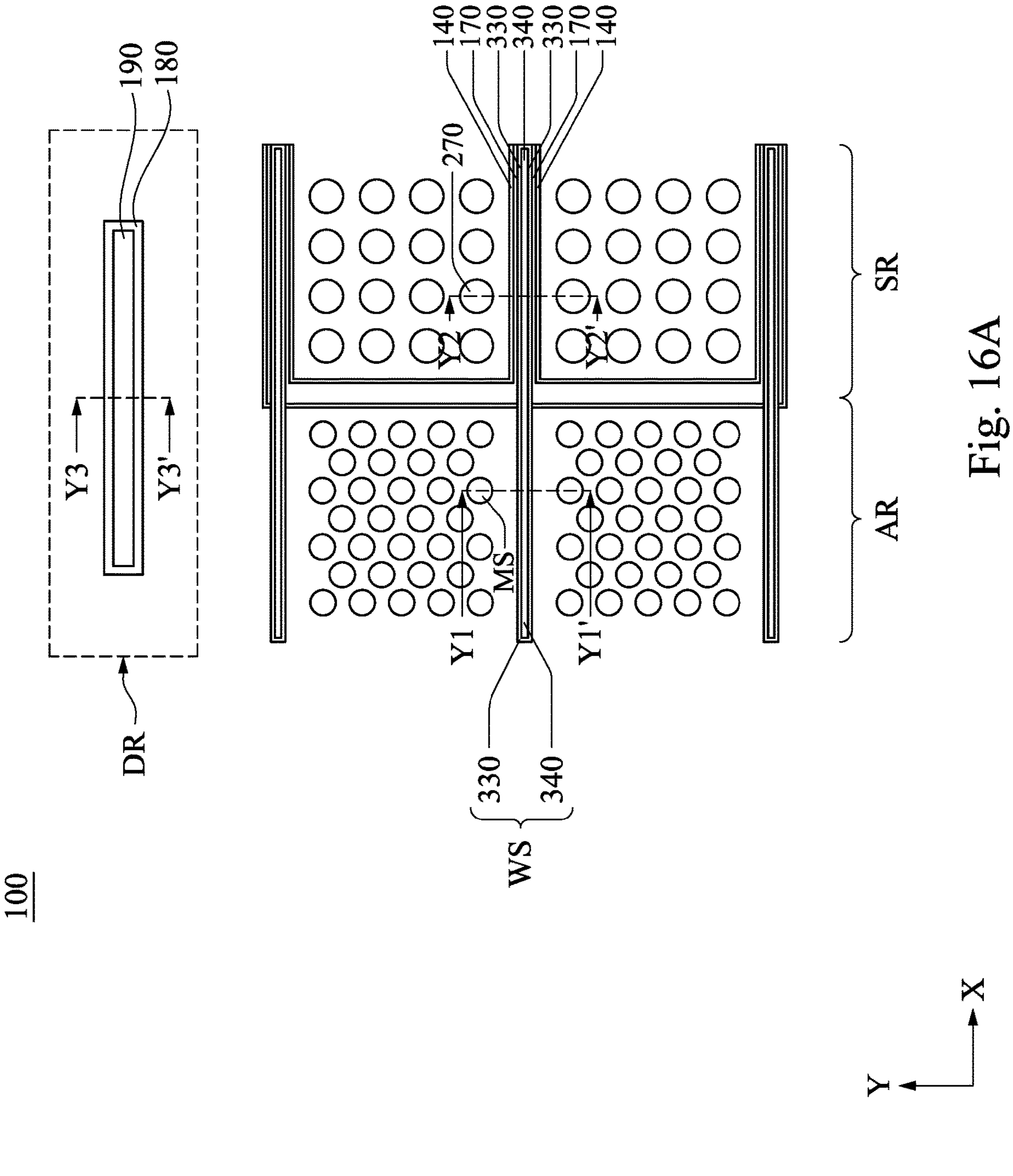
Figure 16B:
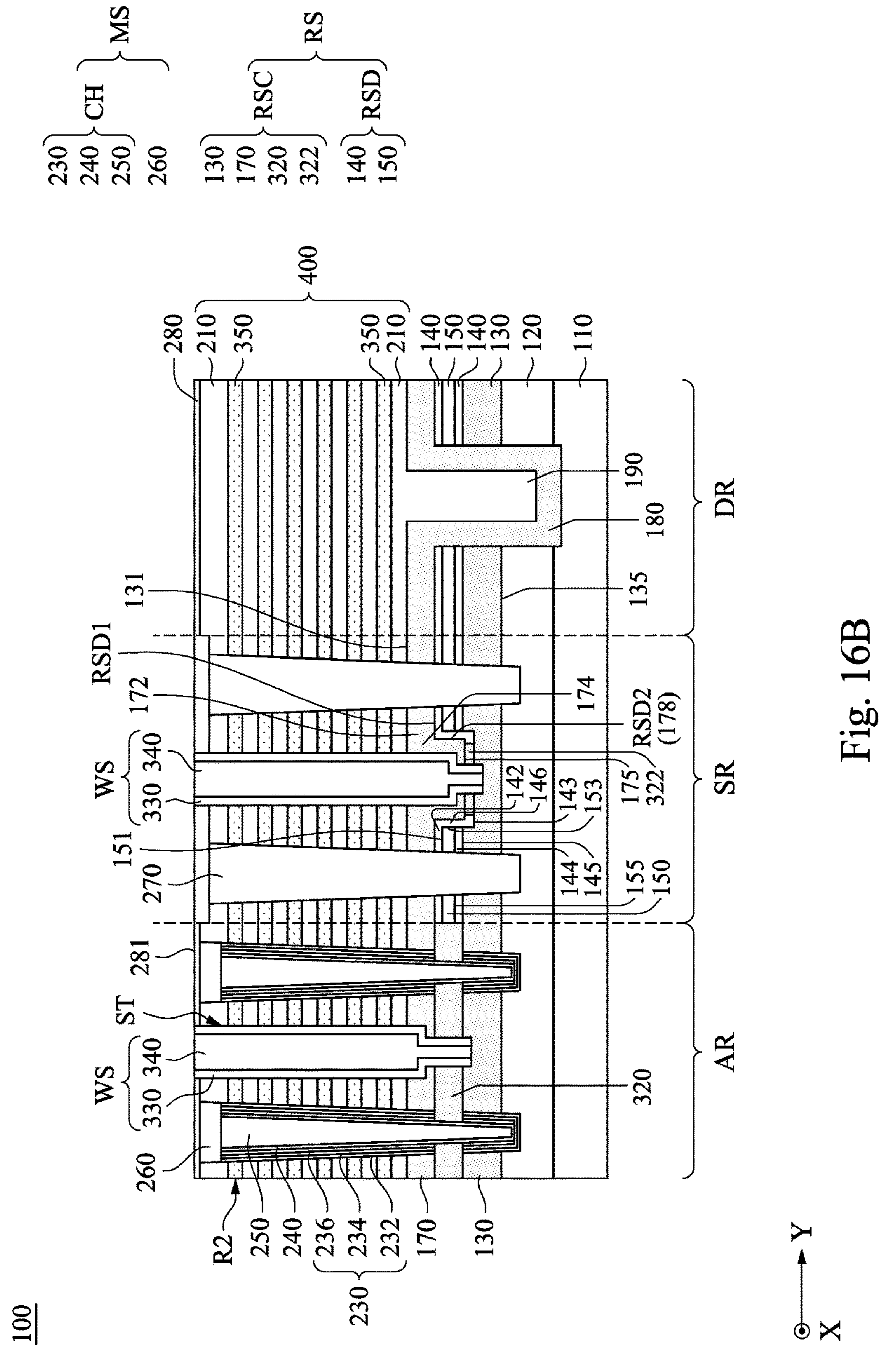

It is noted that the dielectric layer 140*a* and the dielectric material 140*b* are collectively referred as a single dielectric layer 140 described in more detail in FIGS. 16A-16C since the dielectric layer 140*a* and the dielectric material 140*b* include the same material (e.g., oxide).

FIG. 16A is a top view of a step of manufacturing the memory device 100, and FIG. 16B is a cross-sectional view of the memory device 100 including the array region AR, the staircase region SR, and the discharge region DR respectively taken along line Y1-Y1', line Y2-Y2', and line Y3-Y3' in FIG. 16A. Referring to FIGS. 15A-15B and 16A-16B, the sacrificial material layers 220 are replaced with a plurality of conductive layers 350. In greater details, an entirety of the sacrificial material layers 220 is removed to form recesses R2 such that the recesses R2 are communicated with the slit trenches ST. In some embodiments, the sacrificial material layers 220 are removed using a wet etching process, in which the wet etching process may use phosphoric acid solution or other suitable acidic etching solutions. In some embodiments, the support pillar structures 270 provide the structural support to prevent the memory device 100 from collapsing during the removal of the sacrificial material layers 220.

After removing the sacrificial material layers 220 to form the recesses R2, conductive materials are filled in the recesses R2 and then performing an etching process to remove the excess conductive materials so as to form the conductive layers 350. The conductive layers 350 may be referred to as gate layers or word lines. Specifically, the conductive layers 350 may be used as control gate electrodes of the memory device 100 (in particular with a vertical NAND memory device). The insulating layers 210 and conductive layers 350 are collected referred as a stacked structure 400 over the second conductive layer 170 of reference structure RS. In some embodiments, filling conductive materials in the recesses R2 is performed by using a chemical vapor deposition, an atomic layer deposition, a physical vapor deposition, an electroless plating process, or other suitable deposition processes. In some embodiments, the conductive layers 350 include metal (e.g., tungsten) or other suitable conductive materials.

After the sacrificial material layers 220 are replaced with the conductive layers 350, wall structures WS are formed in the slit trenches ST. In greater details, each of the wall structures WS includes a conductive material 340 with an insulating material 330 on sidewalls. The insulating material 330 may be formed in the slit trenches ST by using a deposition process, and then the conductive material 340 is filled in the slit trenches ST. The insulating material 330 may be formed by using a chemical vapor deposition process, an atomic layer deposition process, a physical vapor deposition process or other suitable deposition processes. The insulating material 330 includes oxide (e.g., silicon oxide) or other suitable dielectric materials. In some embodiments, the insulating material 330, the insulating layer 280 and/or the insulating layers 210 include the same material (e.g., oxide). In some embodiments, the conductive material 340 is formed by using a chemical vapor deposition process, an atomic layer deposition process, a physical vapor deposition process, or other suitable deposition processes. The conductive material 340 may include semiconductor material (e.g., polysilicon), metal or other suitable conductive materials. In some embodiments, the conductive material 340, the conductive plug 260, the bottom electrode layer 320, the conductive material 322, the first conductive layer 130 and/or the second conductive layer 170 include the same material, such as polysilicon.

In some embodiments, a planarization process (e.g., a chemical mechanical polishing process) is performed to remove excess materials of the insulating material 330 and/or the conductive material 340. For example, the insulating layer 280 serves as an etching stop layer for performing the planarization process, such that a top surface of each of the wall structures WS (i.e., a top surface of the conductive material 340 and a top surface of the insulating material 330) is substantially coplanar with the top surface 281 of the insulating layer 280.

In some embodiments, the wall structures WS are located on the sidewalls of the conductive layers 350, the sidewalls of the insulating layers 210, and the sidewalls of the second conductive layer 170. In other words, the wall structures WS downwards penetrate through the conductive layers 350, the insulating layers 210, and the second conductive layer 170. Further, each of the wall structures WS has a lower portion embedded in the first conductive layer 130. In some embodiments, the insulating material 330 is configured to separate the conductive material 340 from the conductive layers 350 to avoid an electrical contact between the conductive material 340 and the conductive layers 350. The conductive material 340 of each of the wall structures WS is in electrical contact with the first conductive layer 130 in the array region AR and the staircase region SR.

As shown in FIGS. 16A and 16B, the memory device 100 includes the array region AR, the staircase region SR adjacent to the array region AR and the discharge region DR disposed in either array region AR (a region in array region AR without wall structures WS) or the staircase region SR (a region in staircase region SR without support pillar structures 270). The memory device 100 further includes the reference structure RS, the stacked structure 400 and the wall structures WS. The reference structure RS includes the conductive structure RSC and the dielectric structure RSD embedded within the conductive structure RSC in the staircase region SR. The dielectric structure RSD includes the first dielectric layer 150 and the second dielectric layer 140 disposed on the top surface 151, the sidewall 153, and a bottom surface 155 of the first dielectric layer 150. The sidewall 153 of the first dielectric layer 150 is connected to the top surface 151 and the bottom surface 155 of the first dielectric layer 150. In other words, the second dielectric layer 140 extends from the top surface 151 of the first dielectric layer 150, passing through the sidewall 153 of the first dielectric layer 150, to the bottom surface 155 of the first dielectric layer 150. The stacked structure 400 includes the conductive layers 350 and the insulating layers 210 alternately stacked over the reference structure RS. The wall structures WS penetrate the stacked structure 400 and beyond the dielectric structure RSD. It is noted that the term of "beyond" herein means that a bottommost surface of the wall structures WS is below a bottommost surface 143 of the dielectric structure RSD along the direction perpendicular to the plane defined by the first direction X and the second direction Y. The wall structures WS are in electrical contact with the reference structure RS.

In some embodiments, as shown in FIG. 16B, the dielectric structure RSD is vertically between the first conductive layer 130 and the second conductive layer 170 along the direction perpendicular to a plane defined by the first direction X and the second direction Y. In some embodiments, with respect to the staircase region SR, the second dielectric layer 140 is in contact with the conductive structure RSC, while the first dielectric layer 150 is separated from the conductive structure RSC by the second dielectric layer 140.

In some embodiments, the conductive structure RSC of the reference structure RS includes the first conductive layer 130, the second conductive layer 170, the bottom electrode layer 320 and the conductive material 322. The first conductive layer 130 is disposed under the dielectric structure RSD, and the second conductive layer 170 is disposed over the first conductive layer 130. The bottom electrode layer 320 is vertically between the first conductive layer 130 and the second conductive layer 170 in the array region AR, and the bottom electrode layer 320 is in electrical contact with the first conductive layer 130, the second conductive layer 170 and the channel layers 240 of the memory structures MS. The conductive material 322 is vertically between the first conductive layer 130 and the second conductive layer 170 in the staircase region SR along the direction perpendicular to the plane defined by the first direction X and the second direction Y, and the conductive material 322 is laterally between the dielectric structure RSD and the wall structures WS along the second direction Y. In some embodiments, the dielectric structure RSD is disposed between the first conductive layer 130 and the second conductive layer 170 in the staircase region SR. In some embodiments, the second conductive layer 170 includes a first portion 172 along a top surface RSD1 of the dielectric structure RSD and a second portion 174 along a sidewall RSD2 of the dielectric structure RSD in the staircase region SR. The second portion 174 of the second conductive layer 170 is in contact with the dielectric structure RSD and one of the wall structures WS. The second portion 174 of the second conductive layer 170 has an L-shaped cross-section. The second dielectric layer 140 of the dielectric structure RSD is in contact with a sidewall 178 of the second portion 174 of the second conductive layer 170.

In some embodiments, the second dielectric layer 140 of the dielectric structure RSD covers the top surface 151 of the first dielectric layer 150, the sidewall 153 of the first dielectric layer 150, and the bottom surface 155 of the first dielectric layer 150. In some embodiments, the second dielectric layer 140 includes a first portion 142 over the top surface 151 of the first dielectric layer 150, a second portion 144 under the bottom surface 155 of the first dielectric layer 150 and an extension portion 146 extending from the first portion 142 to the second portion 144. The first portion 142 of the second dielectric layer 140 is in parallel with the second portion 144 of the second dielectric layer 140. The extension portion 146 of the second dielectric layer 140 extends downward from a bottom surface 145 of the second dielectric layer 140. The extension portion 146 of the second dielectric layer 140 extends to the bottom surface 175 of the second portion 174 of the second conductive layer 170. The extension portion 146 of the second dielectric layer 140 has an L-shaped cross-section. In some embodiments, the bottommost surface 143 of the extension portion 146 of the second dielectric layer 140 of the dielectric structure RSD is below the topmost surface 131 of the first conductive layer 130. In some embodiments, a material (e.g., nitride) of the first dielectric layer 150 is different from a material (e.g., oxide) of the second dielectric layer 140.

In some embodiments, the memory device 100 further includes memory structures MS in the array region AR, the support pillar structure 270 in the staircase region SR and the discharge electrode 180 in the discharge region DR. The memory structures MS downwards penetrate through the conductive layers 350, the insulating layers 210, and the reference structure RS and extend to the insulating layer 120 in the array region AR. The memory structures MS are in electrical with the bottom electrode layer 320 of the reference structure RS. The support pillar structures 270 downwards penetrate through the conductive layers 350, the insulating layers 210, and the reference structure RS and extend to the insulating layer 120 in the staircase region SR. Each of the support pillar structures 270 include a lower portion surrounded by the first conductive layer 130, the dielectric structure RSD and the second conducive layer 170 of the reference structure RS. The discharge electrode 180 extends downwards from the bottom surface 135 of the first conductive layer 130 of the reference structure RS and in electrical contact with the reference structure RS. In some embodiments, the dielectric structure RSD is in contact with one of the support pillar structures 270 and spaced apart from the wall structures WS. In other words, the dielectric structure RSD is separated from the wall structures WS by the second portion 174 of the second conductive layer 170.

In some embodiments, as shown in FIG. 16A, the memory structures MS are arranged in multiple rows along the second direction Y, in which the memory structures MS may be referred as vertical NAND memory strings. The wall structures WS extend along the first direction X in the array region AR and the staircase region SR. The memory structures MS is disposed in the array region AR and the support pillar structures 270 is disposed in the staircase region SR. The wall structures WS are configured to divide the memory device 100 into multiple blocks. For example, the memory structures MS and the support pillar structures 270 between the two adjacent wall structures WS are referred as one block.

Figure 22:
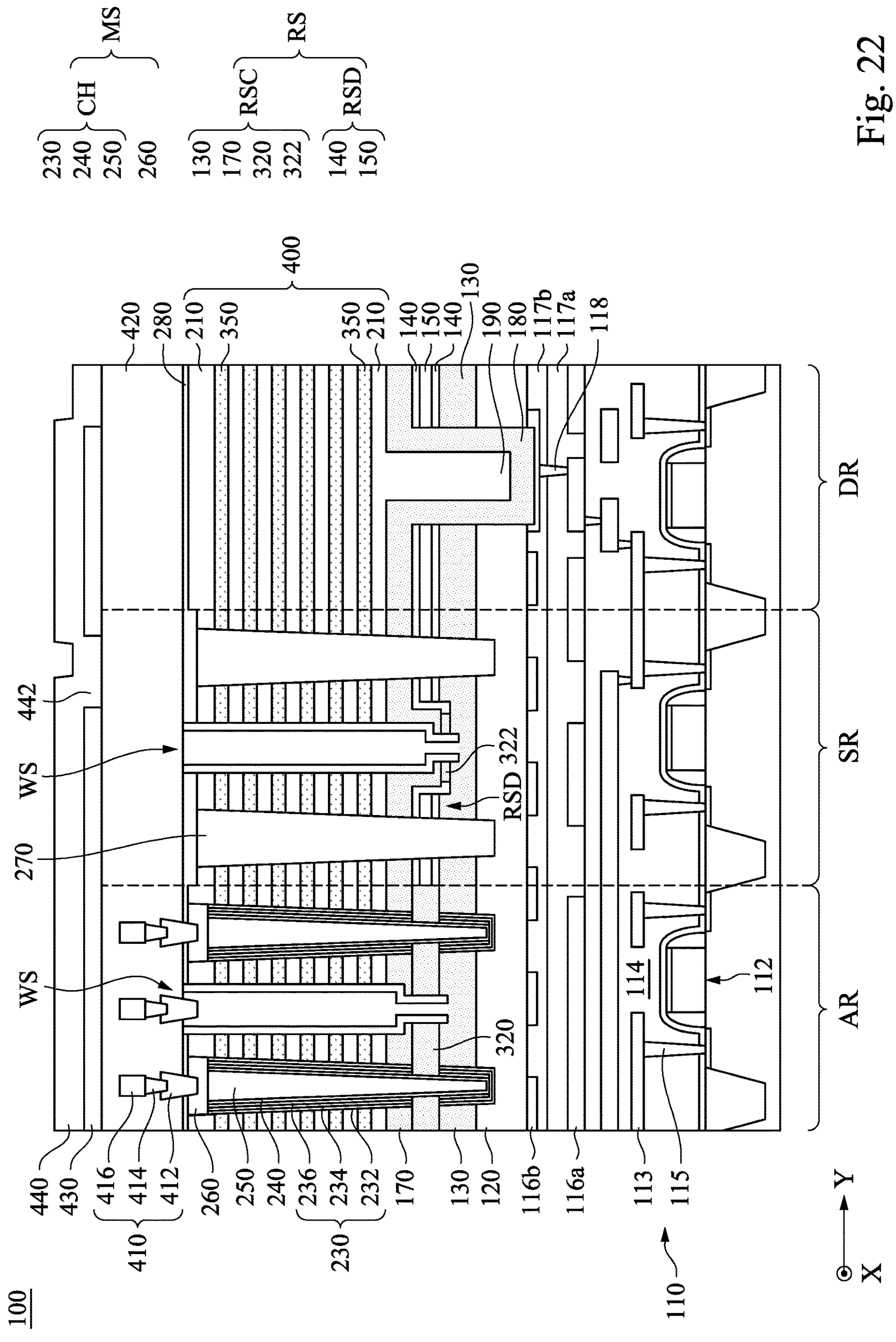
FIG. 22 is a cross-sectional view of the memory device including metal layers and a passivation layer according to some embodiments of the present disclosure.

FIG. 22 is a cross-sectional view of the memory device 100 including metal layers 430 and a passivation layer 440 according to some embodiments of the present disclosure. The memory device 100 further includes conductive features 410, an insulating layer 420, the metal layer 430, and the passivation layer 440. The conductive features 410 may include multiple conductive features 412, 414, and 416 formed on the memory structures MS and the wall structures WS in the array region AR. The conductive features 412 are in electrical contact with the memory structures MS or the wall structures WS in the array region AR, the conductive features 414 are formed on and in electrical contact with the conductive features 412, and the conductive features 416 are formed on and in electrical contact with the conductive features 414. The insulating layer 420 is formed on the insulating layer 280 and surrounds the conductive features 410. The metal layers 430 are formed on the insulating layer 420 in the array region AR, the staircase region SR, and the discharge region DR. The passivation layer 440 is formed on the metal layers 430 in the array region AR, the staircase region SR, and the discharge region DR. The passivation layer 440 has a portion 442 in contact with sidewalls of the metal layers 430.

In some embodiments, the substrate 110 is referred as a circuit under array layer. The substrate 110 includes device structures 112, an interconnect structure, and bonding structure. The device structures 112 are active devices (e.g., transistors). The interconnect structure is connected to the device structures 112, and the interconnect structure includes conductive lines 113 that provide interconnections (wiring) between the device structures 112, and between conductive lines 113 themselves. The conductive lines 113 may be insulated from each other by inter-metal dielectric (IMD) layers 114. The interconnect structure may further include various conductive features 115 located within the IMD layers 114 for connecting the conductive lines 113. The bonding structure of the substrate 110 includes bonding pads 116*a* and 116*b* and dielectric material 117*a* and 117*b*. The bonding structure of the substrate 110 may further include a bonding feature 118 connecting the bonding pads 116*a* and 116*b*.

Figure 23:
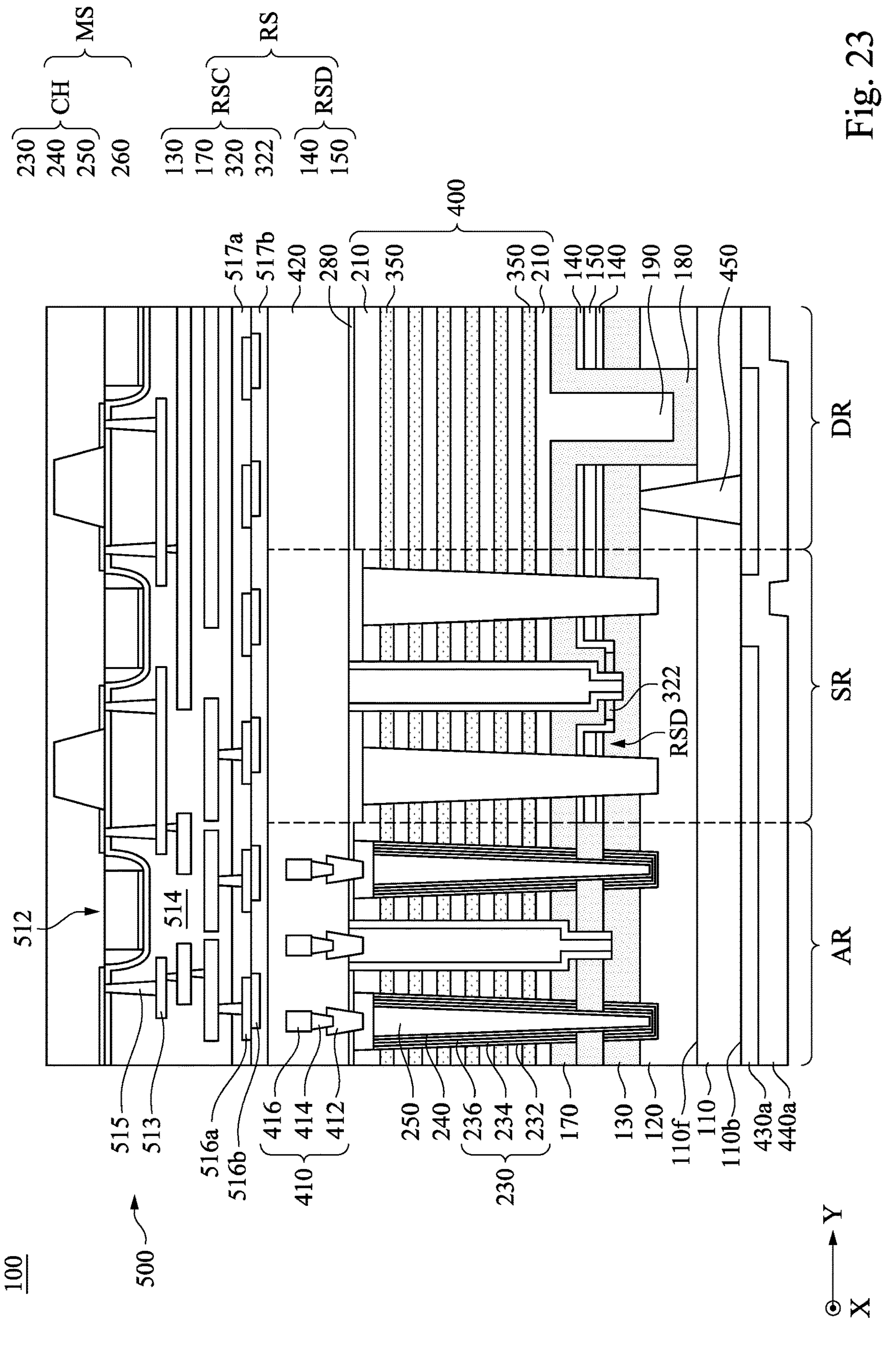
FIG. 23 is a cross-sectional view of the memory device including metal layers and a passivation layer according to some embodiments of the present disclosure.

FIG. 23 is a cross-sectional view of the memory device 100 including metal layers 430*a* and a passivation layer 440*a* according to some embodiments of the present disclosure. The memory device 100 further includes the conductive features 410, the insulating layer 420, the metal layer 430*a*, the passivation layer 440*a*, a conductive feature 450, and a substrate 500. The conductive features 410 may include multiple conductive features 412, 414, and 416 formed on the memory structures MS and the wall structures WS in the array region AR. The insulating layer 420 is formed on the insulating layer 280 and surrounds the conductive features 410. The metal layers 430*a* are formed on a backside side 110*b* of the substrate 110 in the array region AR, the staircase region SR and the discharge region DR. The passivation layer 440 is formed the backside side 110*b* of the substrate 110 and under the metal layers 430. The conductive feature 450 is in electrical contact with the first conductive layer 130 and the metal layer 430*a*.

In some embodiments, the substrate 500 is disposed over the stacked structure 400 (i.e., over a front side 110*f* of the substrate 110). The substrate 500 includes device structures 512, an interconnect structure and bonding structure. The device structures 512 are active devices (e.g., transistors). The interconnect structure is connected to the device structures 512, and the interconnect structure includes conductive lines 513 that provide interconnections (wiring) between the device structures 512, and between conductive lines 513 themselves. The conductive lines 513 may be insulated from each other by inter-metal dielectric (IMD) layers 514. The interconnect structure may further include various conductive features 515 located within the IMD layers 514 for connecting the conductive lines 513. The bonding structure of the substrate 500 includes bonding pads 516*a* and 516*b* and dielectric material 517*a* and 517*b*. In some embodiments, the substrate 500 is bonded on the stacked structure 400 by a hybrid bonding process. The hybrid bonding process involves at least two bonding types, including metal-to-metal bonding and non-metal-to-non-metal bonding. For example, the bonding pads 516*a* and the bonding pads 516*b* are bonded by metal-to-metal bonding, and the dielectric material 517*a* and the dielectric material 517*b* are bonded by non-metal-to-non-metal bonding.

According to the aforementioned embodiments of the present disclosure, since the reference structure includes a conductive structure and the dielectric structure embedded within the conductive structure in the staircase region, the damage of the support pillar structure during etching processes (e.g., the etching process of exposing the channel layer of the memory structure) can be avoided or prevented, thereby avoiding deformation or collapse problems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A memory device, comprising:

an array region and a staircase region;

a reference structure disposed in the array region and the staircase region, the reference structure comprising a conductive structure and a dielectric structure embedded within the conductive structure in the staircase region, wherein the dielectric structure comprises:

a first dielectric layer; and a second dielectric layer disposed on a top surface of the first dielectric layer, a sidewall of the first dielectric layer and a bottom surface of the first dielectric layer, wherein the sidewall of the first dielectric layer is connected to the top surface of the first dielectric layer and the bottom surface of the first dielectric layer, wherein the conductive structure comprises:

a first conductive layer under the dielectric structure; and a second conductive layer over the dielectric structure in the staircase region and over the first conductive layer, wherein a bottommost surface of the second dielectric layer of the dielectric structure is below a topmost surface of the first conductive layer;

a stacked structure comprising a plurality of conductive layers and a plurality of insulating layers alternately stacked over the reference structure, and the stacked structure disposed in the array region and the staircase region; and a wall structure extending along a direction from the array region to the staircase region, penetrating the stacked structure and beyond the dielectric structure.

2. The memory device of claim 1, wherein the second conductive layer includes a first portion along a top surface of the dielectric structure and a second portion along a sidewall of the dielectric structure in the staircase region.

3. The memory device of claim 1, further comprising:

a discharge electrode extending downwards from a bottom surface of the first conductive layer and in electrical contact with the reference structure.

4. The memory device of claim 2, wherein the second dielectric layer of the dielectric structure is in contact with a sidewall of the second portion of the second conductive layer.

5. The memory device of claim 2, wherein a portion of the second dielectric layer of the dielectric structure extends to a bottom surface of the second portion of the second conductive layer.

6. The memory device of claim 1, further comprising:

a substrate over the stacked structure.

7. The memory device of claim 1, wherein the wall structure is in electrical contact with the reference structure.

8. The memory device of claim 1, further comprises:

a discharge electrode extending downwards from a bottom surface of the reference structure and in electrical contact with the reference structure in a discharge region.

9. The memory device of claim 8, wherein a ratio of a thickness of the second conductive layer to a width of the discharge electrode is larger than 2.

10. The memory device of claim 1, wherein the first dielectric layer and the second dielectric layer comprise different materials.

11. A memory device, comprising:

a reference structure including a conductive structure and a dielectric structure embedded within the conductive structure, wherein the dielectric structure comprises:

a first dielectric layer; and a second dielectric layer, wherein the second dielectric layer comprises an upper portion on the first dielectric layer, a lower portion below the first dielectric layer, and an extension portion connected to the upper portion and the lower portion, wherein the extension portion has a bottom surface below a bottom surface of the lower portion;

a stacked structure including a plurality of conductive layers and a plurality of insulating layers alternately stacked over the reference structure; and a wall structure penetrating the stacked structure and beyond the dielectric structure.

12. The memory device of claim 11, wherein the second dielectric layer of the dielectric structure covers a top surface of the first dielectric layer, a sidewall of the first dielectric layer and a bottom surface of the first dielectric layer.

13. The memory device of claim 11, wherein the extension portion of the second dielectric layer of the dielectric structure has an L-shaped cross-section.

14. The memory device of claim 11, wherein the conductive structure comprises:

a first conductive layer; and a second conductive layer over the first conductive layer, wherein the dielectric structure is between the first conductive layer and the second conductive layer.

15. The memory device of claim 14, further comprising:

a discharge electrode extending downwards from the first conductive layer and in electrical contact with the reference structure.

16. The memory device of claim 14, wherein the bottom surface of the extension portion of the second dielectric layer of the dielectric structure is below a topmost surface of the first conductive layer.

17. The memory device of claim 11, further comprising:

a discharge electrode extending downwards from the reference structure and in electrical contact with the reference structure.

18. The memory device of claim 11, wherein the wall structure comprises a conductive material with an insulating material on sidewalls.

19. A manufacturing method of a memory device, comprising:

forming a first conductive layer and a dielectric stack in an array region and a staircase region of the memory device;

forming an opening in a first portion of the dielectric stack in the staircase region;

depositing a dielectric material over a top surface of the dielectric stack and lining the opening, wherein the dielectric material is in contact with a top surface of the first conductive layer;

forming a second conductive layer over the dielectric material and filling the opening;

forming insulating layers and sacrificial material layers alternately stacked over the second conductive layer;

forming a memory structure through the insulating layers, the sacrificial material layers, the second conductive layer, the dielectric stack and the first conductive layer in the array region;

forming a slit trench through the insulating layers, the sacrificial material layers and the second conductive layer in the array region and the staircase region, wherein the slit trench exposes a sidewall of the second conductive layer and a sidewall of the dielectric material in the staircase region;

performing an etching process to remove a second portion of the dielectric stack in the array region to expose the memory structure, wherein the first portion of the dielectric stack in the staircase region remains after the etching process is complete;

forming a bottom electrode layer in electrical contact with the memory structure; and replacing the sacrificial material layers with conductive layers.

* * * * *